US012813257B2

(12) United States Patent
Xiao et al.

(10) Patent No.: US 12,813,257 B2
(45) Date of Patent: Nov. 24, 2026

(54) SEMICONDUCTOR DEVICES AND METHODS FOR FORMING THE SAME

(71) Applicant: YANGTZE MEMORY TECHNOLOGIES CO., LTD., Wuhan (CN)

(72) Inventors: Meng Xiao, Wuhan (CN); Kuan Dong, Wuhan (CN); Longdong Liu, Wuhan (CN); Zhou He, Wuhan (CN); Xianghui Zhao, Wuhan (CN); Zuixin Zeng, Wuhan (CN); Gang Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 372 days.

(21) Appl. No.: 18/517,901

(22) Filed: Nov. 22, 2023

(65) Prior Publication Data

US 2025/0105149 A1 Mar. 27, 2025

Related U.S. Application Data

(63) Continuation of application No. PCT/CN2023/121362, filed on Sep. 26, 2023.

(51) Int. Cl.
*H10W 20/41* (2026.01)
*H10B 41/10* (2023.01)
(Continued)

(52) U.S. Cl.
CPC .......... *H10W 20/435* (2026.01); *H10B 41/10* (2023.02); *H10B 41/27* (2023.02); *H10B 43/10* (2023.02); *H10B 43/27* (2023.02)

(58) Field of Classification Search
CPC ..... H10W 20/435; H10B 41/10; H10B 41/27; H10B 43/10; H10B 43/27; H10B 41/50; H10B 43/50
See application file for complete search history.

(56) References Cited

U.S. PATENT DOCUMENTS

| | | | | |
|---|---|---|---|---|
| 10,971,521 B2 * | 4/2021 | Yang | ...................... | H10B 41/10 |
| 12,581,650 B2 * | 3/2026 | Park | ...................... | H10B 43/27 |

(Continued)

FOREIGN PATENT DOCUMENTS

CN 116249350 A * 6/2023

OTHER PUBLICATIONS

International Search Report issued in corresponding International Application No. PCT/CN2023/121362, mailed on Mar. 7, 2024, 3 pages.

*Primary Examiner* — Steven H Loke
*Assistant Examiner* — Khatib A Rahman
(74) *Attorney, Agent, or Firm* — BAYES PLLC

(57) ABSTRACT

A semiconductor device includes a stack comprising interleaved conductive layers and dielectric layers stacked along a first direction, and a contact structure extending through the stack along the first direction. The conductive layers include a first conductive layer and a second conductive layer under the first conductive layer, and the first conductive layer is in contact with the contact structure. The first conductive layer includes a first portion having a first thickness and a second portion having a second thickness less than the first thickness in contact with the contact structure.

10 Claims, 43 Drawing Sheets

(51) Int. Cl.
*H10B 41/27* (2023.01)
*H10B 43/10* (2023.01)
*H10B 43/27* (2023.01)

(56) References Cited

U.S. PATENT DOCUMENTS

| | | | | |
|---|---|---|---|---|
| 2012/0306090 | A1* | 12/2012 | Smith .................... | H10B 41/27<br>257/773 |
| 2021/0193672 | A1 | 6/2021 | Kim et al. | |
| 2024/0074181 | A1* | 2/2024 | Wu ........................ | H10B 41/10 |
| 2025/0105149 | A1* | 3/2025 | Xiao ...................... | H10B 41/10 |

* cited by examiner

100

100

100

1900

1900

1900

1900

3100

3200

3200

3200

SEMICONDUCTOR DEVICES AND METHODS FOR FORMING THE SAME

CROSS-REFERENCE TO RELATED APPLICATIONS

This application is a continuation of International Application No. PCT/CN2023/121362, filed on Sep. 26, 2023, entitled "SEMICONDUCTOR DEVICES AND METHODS FOR FORMING THE SAME," which is incorporated herein by reference in its entirety.

BACKGROUND

The present disclosure relates to memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one aspect, a semiconductor device is disclosed. The semiconductor device includes a stack comprising interleaved conductive layers and dielectric layers stacked along a first direction, and a contact structure extending through the stack along the first direction. The conductive layers include a first conductive layer and a second conductive layer under the first conductive layer, and the first conductive layer is in contact with the contact structure. The first conductive layer includes a first portion having a first thickness and a second portion having a second thickness less than the first thickness in contact with the contact structure.

In some implementations, the second conductive layer has a third thickness less than the first thickness. In some implementations, the second conductive layer is insulated with the contact structure by a spacer layer extending along the first direction.

In some implementations, the first portion of the first conductive layer is disposed above the plurality of dielectric layers, and the second portion of the first conductive layer is disposed above the spacer layer.

In some implementations, the first portion of the first conductive layer is in contact with the second portion of the first conductive layer, and the second portion extrudes out the first portion along a second direction perpendicular to the first direction.

In some implementations, a top surface of the first portion of the first conductive layer is coplanar with a top surface of the second portion of the first conductive layer.

In some implementations, the semiconductor device further includes a semiconductor layer beneath the stack, and a gate line slit structure extending in the stack along the first direction and a third direction perpendicular to the first direction, and the gate line slit structure and the contact structure extend to the semiconductor layer.

In some implementations, the semiconductor device further includes a channel structure extending in the stack along the first direction, and the channel structure and the contact structure extend to the semiconductor layer. In some implementations, the channel structure includes a high dielectric constant (high-k) dielectrics, a silicon oxide layer, a silicon nitride layer, and a semiconductor channel arranged radially from a sidewall towards a center of the channel structure.

In some implementations, the semiconductor device further includes a dummy channel structure extending in the stack along the first direction, and the dummy channel structure and the contact structure extend to the semiconductor layer. In some implementations, the dummy channel structure comprises a sacrificial structure.

In some implementations, the semiconductor device further includes an adhesive layer between the first conductive layer and the contact structure.

In some implementations, the semiconductor device further includes an adhesive layer extending in the first conductive layer along a second direction perpendicular to the first direction.

In some implementations, the stack comprises at least one staircase structure, the first conductive layer is disposed at a topmost layer of the at least one staircase structure.

In another aspect, a method of manufacturing a semiconductor device is disclosed. A contact structure is formed extending through a stack along a first direction. The stack includes interleaved conductive layers and dielectric layers stacked along the first direction. The conductive layers include a first conductive layer and a second conductive layer under the first conductive layer, and the first conductive layer is in contact with the contact structure. The first conductive layer includes a first portion having a first thickness and a second portion having a second thickness less than the first thickness in contact with the contact structure.

In some implementations, a dielectric stack is formed including interleaved first dielectric layers and second dielectric layers. A sacrificial layer is formed on the dielectric stack. A first opening and a second opening are formed extending through the dielectric stack along a first direction. A sacrificial structure is formed in the first opening. The first dielectric layers and the sacrificial layer are replaced with conductive layers to form the stack. The sacrificial structure is removed and a contact structure is formed in the first opening.

In some implementations, the sacrificial structure in the first opening is removed to expose the first opening extending through the stack along the first direction, and the contact structure is formed in the first opening.

In some implementations, the sacrificial layer comprises polysilicon.

In some implementations, an etch operation is performed to remove portions of the dielectric stack to form the first opening and the second opening together.

In some implementations, staircase structures are formed in the dielectric stack, and the sacrificial layer is formed on a topmost layer of each staircase structure.

In some implementations, a portion of the first dielectric layers is removed along sidewalls of the first opening, a spacer layer is formed on the sidewalls of the first opening, and a fourth dielectric layer is formed in the first opening.

In some implementations, the first dielectric layers and the sacrificial layer are removed together to form cavities. A topmost cavity of the cavities has a first width above the second dielectric layers and a second width above the spacer layer, and the first width is greater than the second width.

In some implementations, the fourth dielectric layer is removed to expose the first opening, and a portion of the spacer layer is removed along the sidewalls of the first opening to expose the first conductive layer.

In some implementations, a gate line slit structure is formed in the second opening before forming the contact structure in the first opening.

In some implementations, the contact structure is formed in the first opening in contact with a topmost conductive layer of the plurality of conductive layers.

In some implementations, a dielectric stack is formed including interleaved first dielectric layers and second dielectric layers. A sacrificial layer is formed on the dielectric stack. A first opening and a second opening are formed extending through the dielectric stack along a first direction. A contact structure is formed in the first opening. The first dielectric layers and the sacrificial layer are replaced with conductive layers to form the stack.

In some implementations, a removal operation is performed in the second opening to widen the second opening. A gate line slit structure is formed in the second opening after forming the contact structure in the first opening.

In some implementations, an etch operation is performed to remove portions of the dielectric stack to form the first opening and the second opening together.

In some implementations, a portion of the first dielectric layers is removed along sidewalls of the first opening, a spacer layer is formed on the sidewalls of the first opening, a portion of the spacer layer along the sidewalls of the first opening to expose the sacrificial layer, and the contact structure is formed in the first opening.

In some implementations, the first dielectric layers are removed to form cavities, and the sacrificial layer is removed. A topmost cavity of the cavities has a first width above the second dielectric layers and a second width above the spacer layer, and the first width is greater than the second width.

In some implementations, a topmost conductive layer of the conductive layers is formed in the topmost cavity. The topmost conductive layer has a first thickness above the second dielectric layers and a second thickness above the spacer layer, and the first thickness is greater than the second thickness.

In some implementations, the sacrificial layer is removed to form a first cavity, and a third conductive layer is formed in the first cavity. The first dielectric layers are removed to form a second cavity, a fourth conductive layer is formed in the second cavity. The third conductive layer and the fourth conductive layer collectively form the first conductive layer.

In some implementations, the third conductive layer and the contact structure are formed together.

In some implementations, a channel structure is formed extending through the stack along the first direction, and a dummy channel structure is formed extending through the stack along the first direction. The dummy channel structure is formed after forming the channel structure, and the contact structure is formed after forming the dummy channel structure.

In some implementations, a channel structure is formed extending through the stack along the first direction, and a dummy channel structure is formed extending through the stack along the first direction. The dummy channel and the channel structure are formed together, and the contact structure is formed after forming the dummy channel structure and the channel structure.

In some implementations, a channel structure is formed extending through the stack along the first direction, and a dummy channel structure is formed extending through the stack along the first direction. The dummy channel structure and the contact structure are formed together after forming the channel structure.

In still another aspect, a memory system is disclosed. The memory system includes a memory device configured to store data and a memory controller coupled to the memory device. The semiconductor device includes a stack comprising interleaved conductive layers and dielectric layers stacked along a first direction, and a contact structure extending through the stack along the first direction. The conductive layers include a first conductive layer and a second conductive layer under the first conductive layer, and the first conductive layer is in contact with the contact structure. The first conductive layer includes a first portion having a first thickness and a second portion having a second thickness less than the first thickness in contact with the contact structure. The memory controller is configured to control the memory device through the contact structure.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
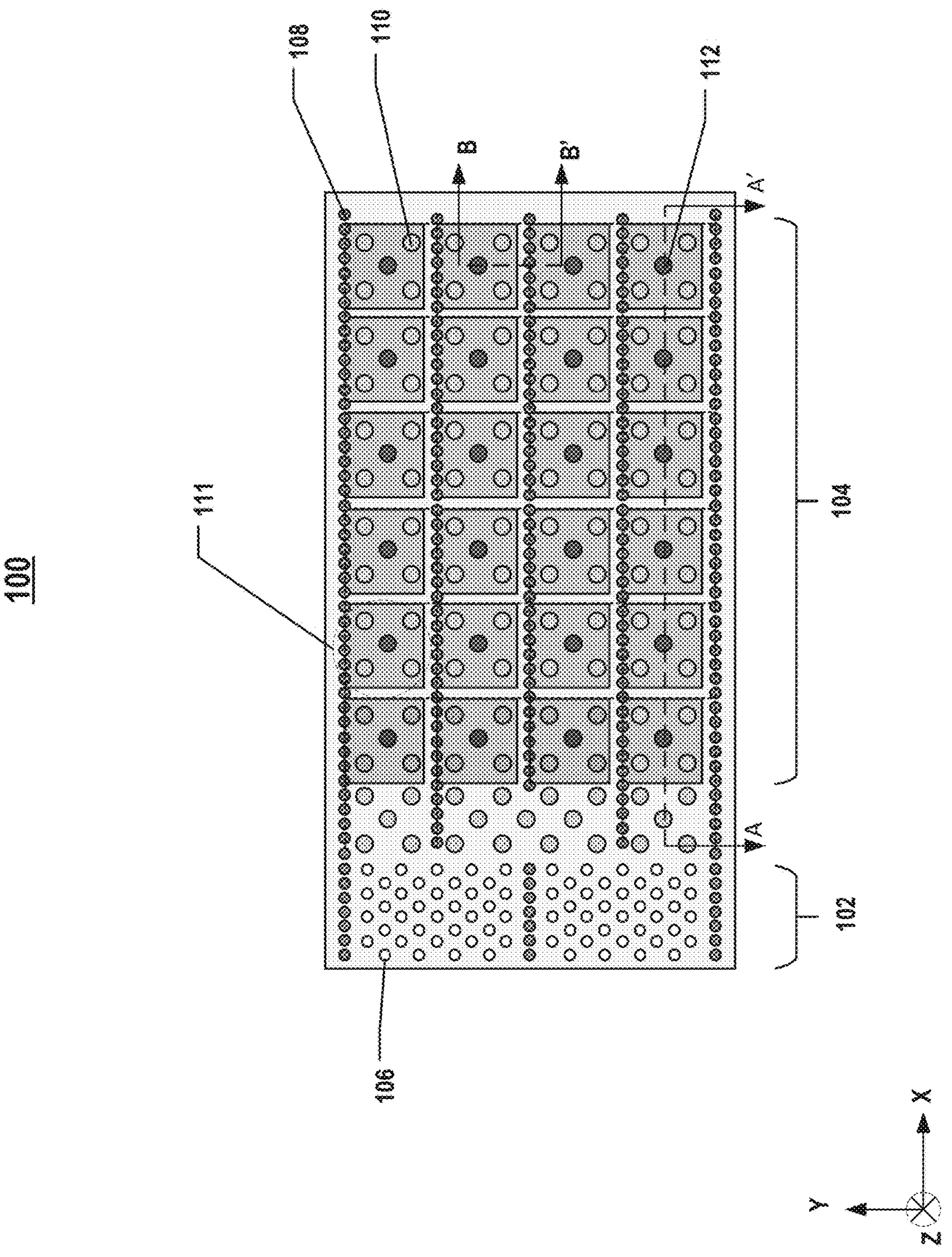
FIG. 1 illustrates a plan view of a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As the progress of the manufacturing technology is applied to the memory products, the number of stacked layers increases, and the process difficulty increases sharply as well. The double-layer or multi-layer stacking structure may only reduce the difficulty of the channel etching but cannot solve the problems of other deep holes. As the number of stacked layers increases, the difficulty of etching these individual deep holes also increases significantly.

To address one or more of the aforementioned issues, the present disclosure introduces a solution in which the photography processes of the channel structure, the gate line slit structure, and the contact structure are merged, and all deep hole etching processes can be completed in a simplified operation. Hence, the manufacturing process can be simplified, and the manufacturing cost can be also reduced. In addition, by forming the structure of different deep holes, some of the holes may be further widened to connect the holes into lines, and the gate line silt structure can therefore be formed.

The present disclosure also introduces the staircase selection layer, e.g., the sacrificial layer, on the staircase structure to connect each staircase structure to the contact structure. The contact structure in the present disclosure penetrates through the memory structure and provides a new possibility for the memory line connection.

Figure 2:
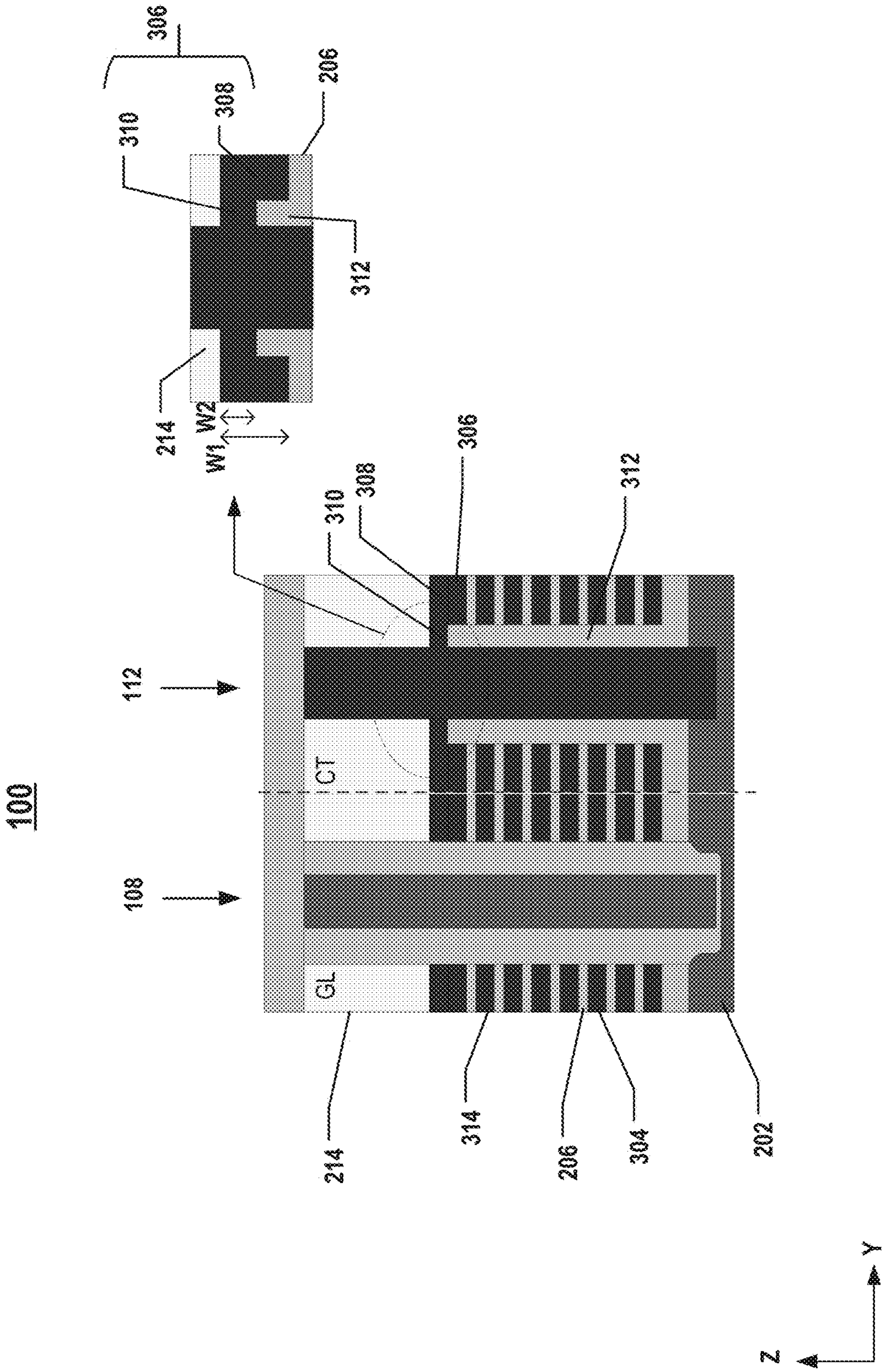
FIG. 2 illustrates a cross-sectional view of a memory device, according to some aspects of the present disclosure.

FIG. 1 illustrates a plan view of a semiconductor device, e.g., a memory device 100, according to some embodiments. FIG. 2 illustrates a cross-sectional view of memory device 100 along line BB' in FIG. 1, according to some aspects of the present disclosure. For the purpose of better describing the present disclosure, the plane view in FIG. 1 and the cross-sectional view in FIG. 2 will be discussed together, and the coordinates of X-direction, Y-direction, and Z-direction are noted in the figures to show the perpendicularity of the cross-sections of the memory stack structure and the staircase structure.

As shown in FIG. 1 and FIG. 2, memory device 100 includes a cell region 102 and a staircase region 104. Channel structures 106 are formed in cell region 102 and extend vertically (along the Z-direction) through the memory stack. Staircase region 104 may include dummy channel structures 110 and contact structures 112. Contact structures 112 are formed in an insulating structure 214, and each contact structure 112 extends vertically (along the Z-direction) through insulating structure 214 and in contact with a respective conductive layer 306 of the plurality of conductive layers 304 in the staircase structure. The support structures, e.g., dummy channel structures 110, are formed in the staircase region 104, and each dummy channel structure 110 extends vertically (along the Z-direction) through the memory stack. Gate line slit structures 108 may extend along the X-direction in cell region 102 and staircase region 104.

FIG. 2 illustrates a cross-sectional view of memory device 100 along line BB' in FIG. 1, according to some aspects of the present disclosure. As shown in FIG. 2, gate line slit structure 108 and contact structure 112 are formed in memory device 100. In some implementations, a stack, e.g., a memory stack, having interleaved conductive layers 304 and dielectric layers 206 are stacked along the Z-direction on a semiconductor layer 202.

In some implementations, dielectric layers 206 may include dielectric materials including, but not limited to, silicon oxide, silicon nitride, silicon oxynitride, or any combination thereof. In some implementations, conductive layers 304 may form the word lines and may include conductive materials including, but not limited to, tungsten (W), cobalt (Co), copper (Cu), aluminum (Al), polysilicon, doped silicon, silicides, or any combination thereof.

Contact structure 112 extends through the stack along the Z-direction. In some implementations, contact structure 112 may include conductive materials including, but not limited to, W, Co, Cu, Al, polysilicon, doped silicon, silicides, or any combination thereof. In some implementations, contact structure 112 and conductive layer 304 may be formed by the same material.

Conductive layers 304 may include a topmost conductive layer, e.g., a first conductive layer 306, and other conductive layers under the topmost conductive layer, e.g., a second conductive layer 314. First conductive layer 306 is in contact with contact structure 112. In some implementations, a spacer layer 312 is formed between contact structure 112 and second conductive layer 314. It is understood that the "topmost conductive layer" used here refers to the topmost conductive layer of each staircase structure 111 shown in FIG. 1, not the whole memory structure. In other words, the topmost conductive layer in different staircase structures 111 may be different conductive layers in the whole memory structure. As shown in FIG. 2, spacer layer 312 extends along the Z-direction and insulates contact structure 112 and second conductive layer 314.

First conductive layer 306 includes a first portion 308 having a first thickness W1 and a second portion 310 having a second thickness W2 less than the first thickness in contact with contact structure 112. First portion 308 of first conductive layer 306 is disposed above second dielectric layer 206, and second portion 310 of first conductive layer 306 is disposed above spacer layer 312.

In other words, first portion 308 of first conductive layer 306 is in contact with second portion 310 of first conductive layer 306, and second portion 310 extrudes out first portion 308 along the Y-direction perpendicular to the Z-direction. In some implementations, a top surface of first portion 308 of first conductive layer 306 is coplanar with a top surface of second portion 310 of first conductive layer 306. In some implementations, second conductive layer 314 has a third thickness less than the first thickness of first portion 308.

In some implementations, gate line slit structures 108 may extend in the stack along the Z-direction and the X-direction perpendicular to the Z-direction, and gate line slit structure 108 and contact structure 112 both extend to a semiconductor layer 202. In some implementations, channel structure 106 in cell region 102 may extend in the stack along the Z-direction, and channel structure 106 and contact structure 112 both extend to a semiconductor layer 202. In some implementations, dummy channel structure 110 may extend in the stack along the Z-direction, and dummy channel structure 110 and contact structure 112 both extend to a semiconductor layer 202.

FIGS. 3-17 illustrate cross-sectional views of the memory device shown in FIG. 2 at various stages of a fabrication process, according to some aspects of the present disclosure. FIG. 18 illustrates a flowchart of a method 1800 for forming a memory device, according to some aspects of the present disclosure. For the purpose of better describing the present disclosure, the memory device 100 in FIGS. 3-17 and method 1800 in FIG. 18 will be discussed together. It is understood that the operations shown in method 1800 are not exhaustive and that other operations may be performed as well before, after, or between any of the illustrated operations. Further, some of the operations may be performed simultaneously, or in a different order than shown in FIGS. 3-17 and FIG. 18.

Figure 3:
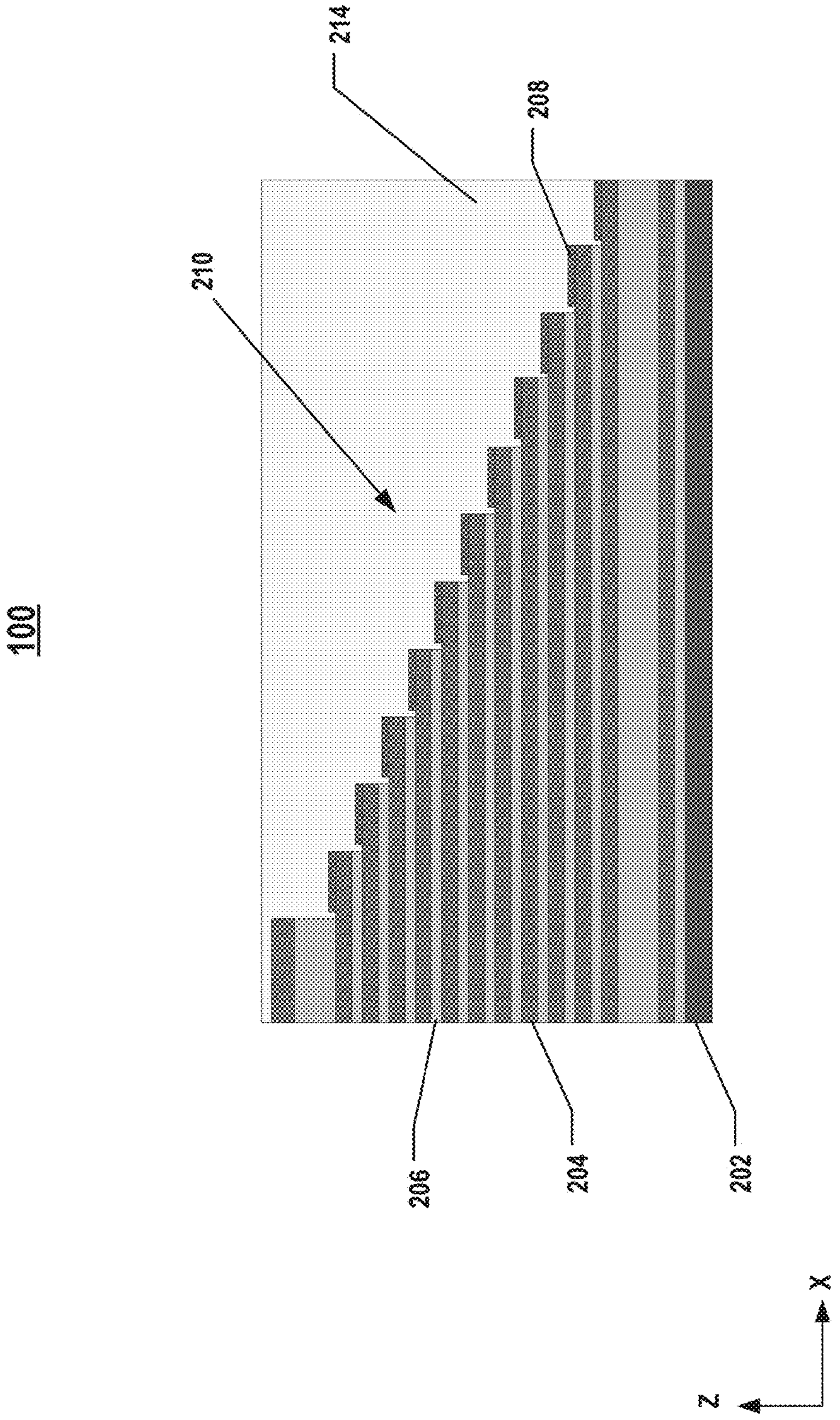
FIGS. 3-17 illustrate cross-sectional views of the memory device shown in FIG. 2 at various stages of a fabrication process, according to some aspects of the present disclosure.

As shown in FIG. 3 and operation 1802 in FIG. 18, a dielectric stack is formed on semiconductor layer 202. FIG. 3 illustrates a cross-sectional view of the memory device along line AA' in FIG. 1. The dielectric stack includes interleaved first dielectric layers 204 and second dielectric layers 206. In some implementations, semiconductor layer 202 may include a doped or undoped polysilicon layer. In some implementations, the dielectric layer pairs, including first dielectric layers 204 and second dielectric layers 206, may extend along the X-direction and the Y-direction. In some implementations, each first dielectric layer 204 may include a layer of silicon nitride, and each second dielectric layer 206 may include a layer of silicon oxide. The dielectric layer pairs may be formed by one or more thin film deposition processes including, but not limited to, chemical vapor deposition (CVD), physical vapor deposition (PVD), atomic layer deposition (ALD), or any combination thereof.

Then, a staircase structure 210 is formed at the outer region of the dielectric stack. In some implementations, the outer region of the dielectric stack may include multiple staircase structures. The corresponding edges of the dielectric stack along the vertical direction away from the bottom of the dielectric stack (the positive Z-direction) can be staggered laterally toward cell region 102. In other words, the edges of the dielectric stack in staircase structure 210 can be tilted toward the inner region of the dielectric stack. In some implementations, the length of the dielectric layer pairs increases from the top to the bottom.

In some implementations, the top layer in each level of staircase structure 210 (e.g., each dielectric layer pair) is first dielectric layer 204. After first dielectric layer 204 is replaced by the conductive layers in the later operations, staircase structure 210 may be the gate line fan-out. In some implementations, the formation of staircase structure 210 may include multiple etch operations.

As shown in FIG. 3 and operation 1804 in FIG. 18, a sacrificial layer 208 is formed on the dielectric stack. After exposing the plurality of first dielectric layers 204 at the outer region of the dielectric stack, sacrificial layer 208 is formed on each first dielectric layer 204 at the outer region of the dielectric stack. In some implementations, sacrificial layer 208 may include a polysilicon layer. Then, staircase structure 210 is covered by insulating structure 214.

Figure 4:
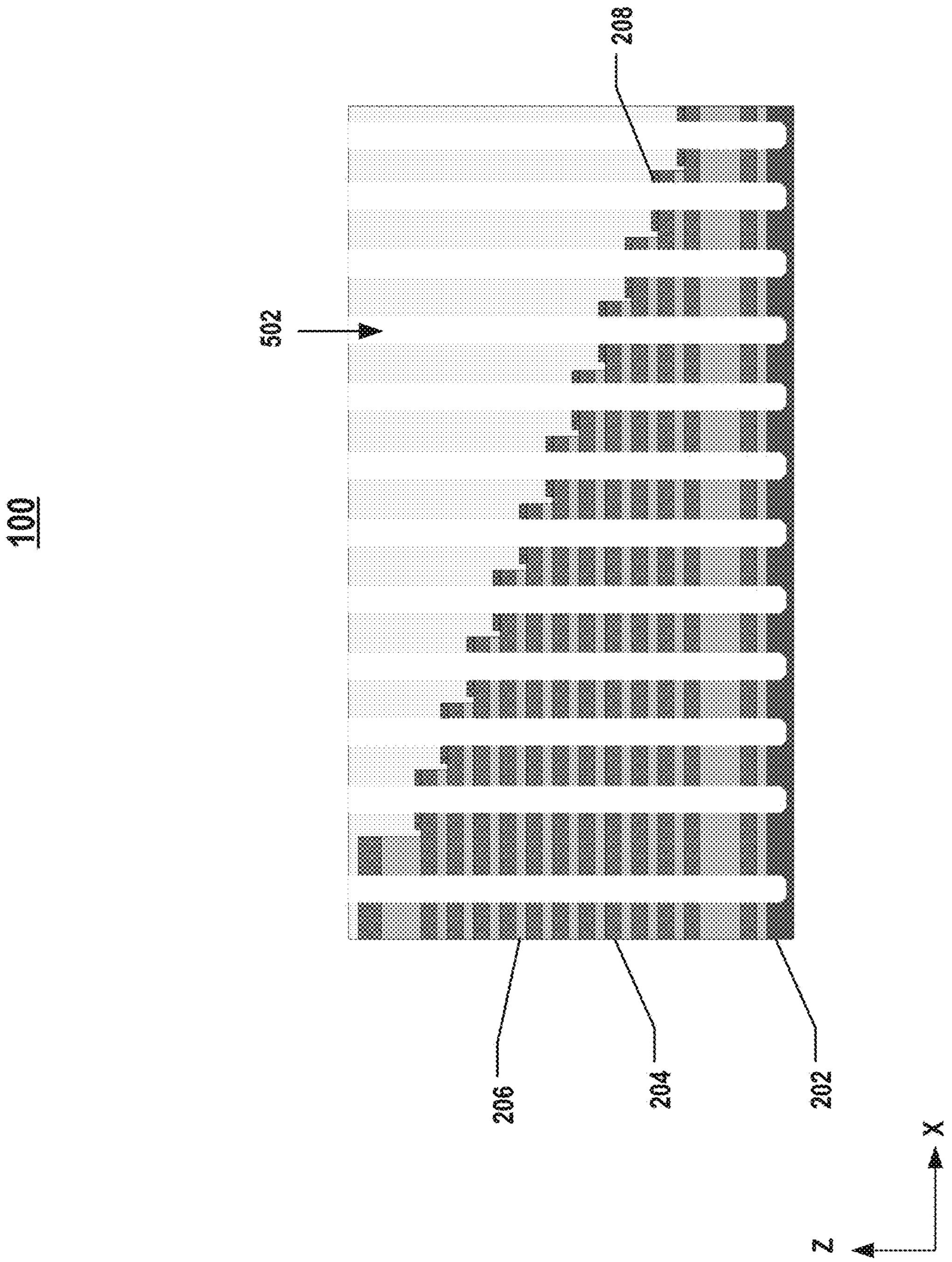
Figure 5:
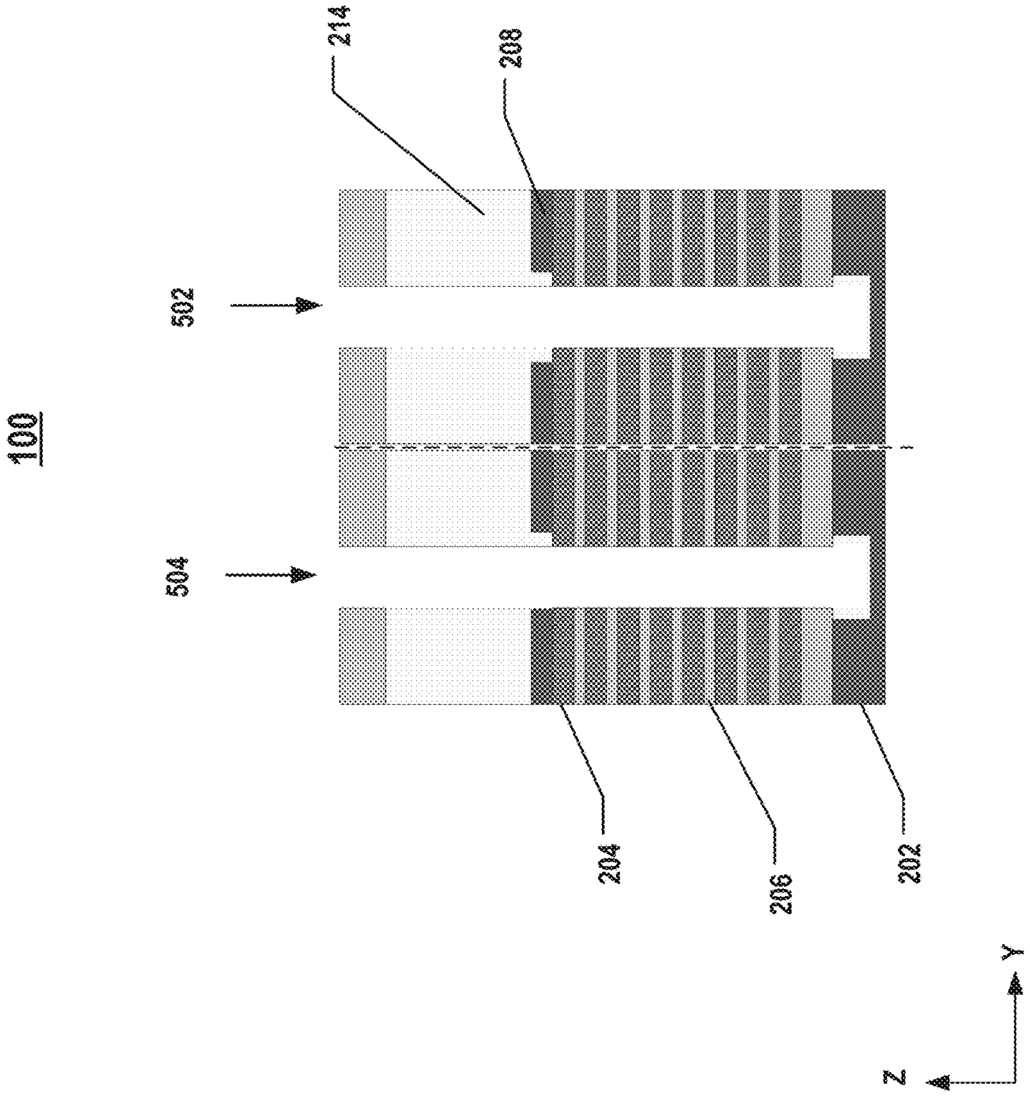

As shown in FIG. 4, FIG. 5, and operation 1806 in FIG. 18, a first opening 502 and a second opening 504 are formed in the dielectric stack and extend through the dielectric stack along the Z-direction. FIG. 4 shows the cross-sectional view of the memory device along line AA' in FIG. 1, so only first opening 502 could be seen in FIG. 4.

In some implementations, an etch operation or multiple etch operations may be performed to remove portions of the dielectric stack to form first opening 502 and second opening 504 together. In some implementations, insulating structure 214, sacrificial layer 208, first dielectric layer 204, and second dielectric layer 206 are removed to form first opening 502 and second opening 504 together. As shown in FIG. 5, first opening 502 and second opening 504 may have a same depth extending to semiconductor layer 202. In some implementations, first opening 502, second opening 504, and channel structure openings (not shown) may be formed together in the same etch operations, and first opening 502, second opening 504, and channel structure openings may have the same depth extending to semiconductor layer 202. In some implementations, after first opening 502 and second opening 504 are formed, an oxidation operation may be performed to form an insulation layer on the exposed substrate, e.g., semiconductor layer 202. In some implementations, when sacrificial layer 208 includes polysilicon, the exposed surface of sacrificial layer 208 may be also oxidized. By forming first opening 502, second opening 504, and channel structure openings together, the process steps could be significantly reduced, and the manufacturing cost could be also lowered.

Figure 6:
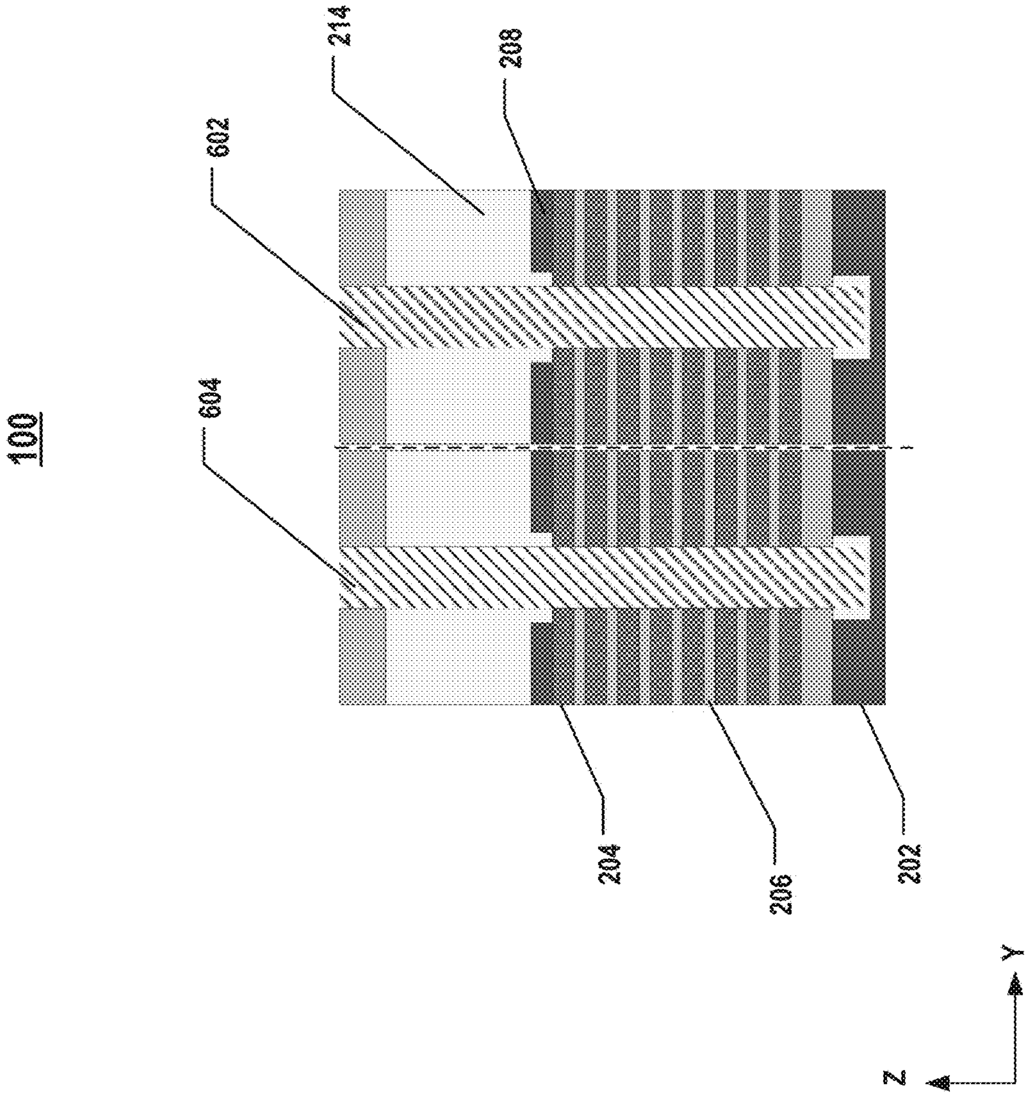
Figure 7:
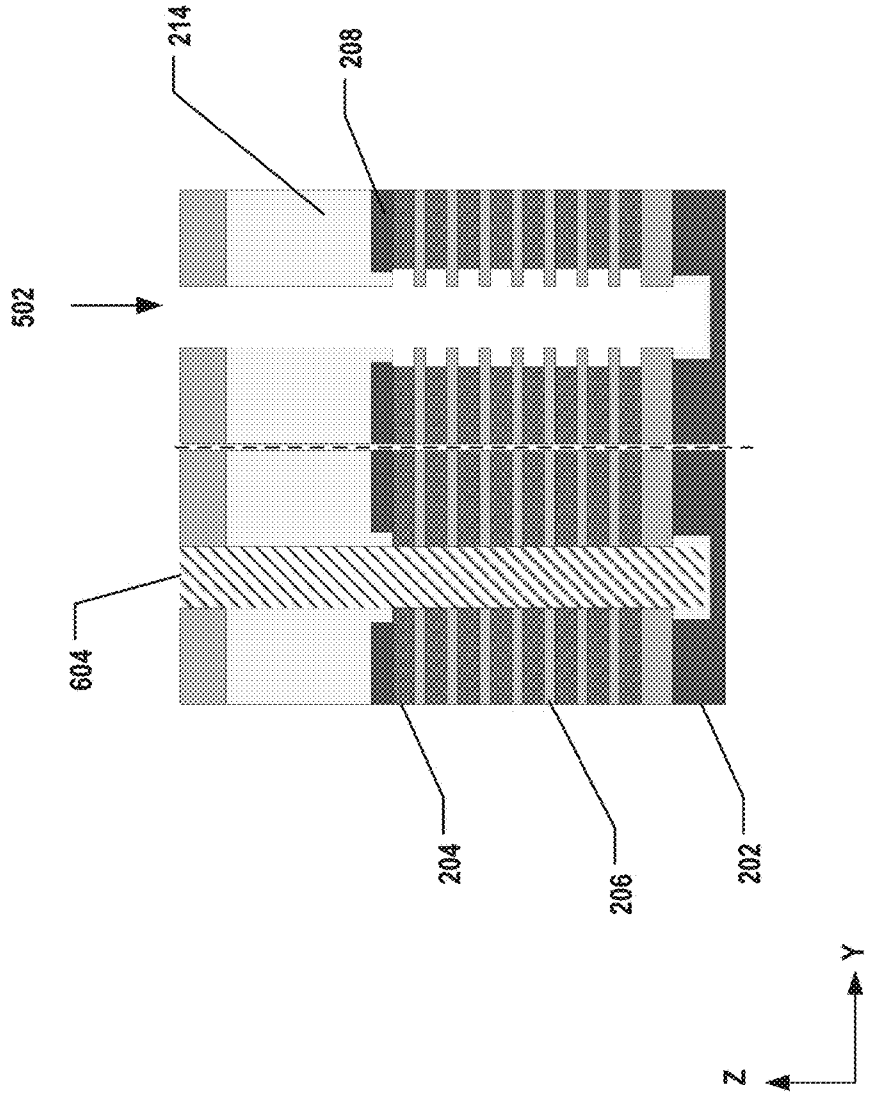

As shown in FIG. 6, after forming first opening 502 and second opening 504, a first sacrificial filling 602 is formed in first opening 502, and a second sacrificial filling 604 is formed in second opening 504. In some implementations, first sacrificial filling 602 and second sacrificial filling 604 are formed in first opening 502 and second opening 504 together in a same deposition process. Then, as shown in FIG. 7, first sacrificial filling 602 may be removed to expose first opening 502. In some implementations, in the operation of removing first sacrificial filling 602, portions of first dielectric layer 204 may be also removed. In other words, sacrificial layer 208 may extrude along the sidewalls of first opening 502, as shown in FIG. 7. The extruding structure of sacrificial layer 208 may form a specific shape of the topmost conductive layer in a later operation.

Figure 8:
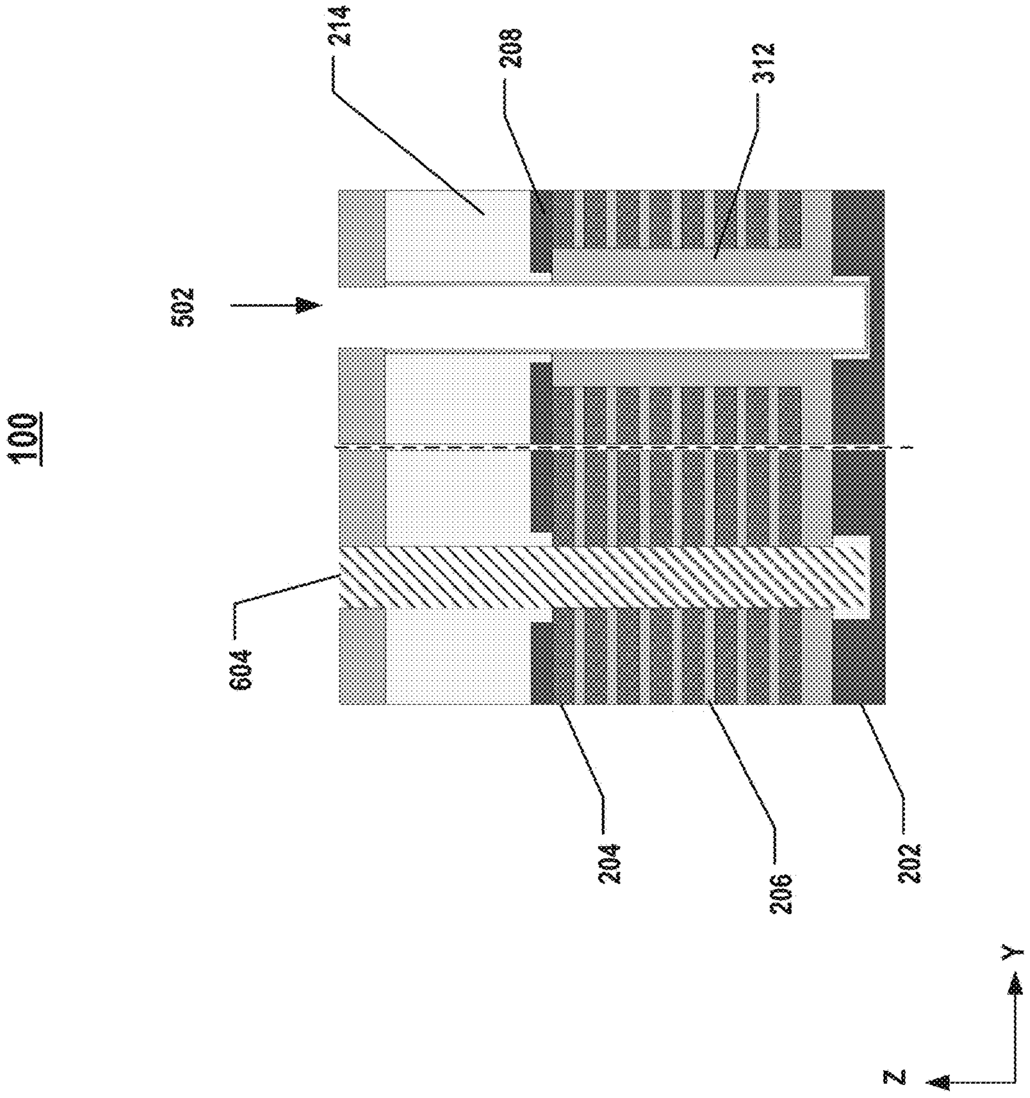

As shown in FIG. 8, spacer layer 312 is formed on the sidewalls of first opening 502. In some implementations, spacer layer 312 may include silicon oxide. After forming spacer layer 312 on the sidewalls of first opening 502, a portion of sacrificial layer 208 is above spacer layer 312, as shown in FIG. 8. In other words, the extruding structure of sacrificial layer 208 may cover the top surface of spacer layer 312.

Figure 9:
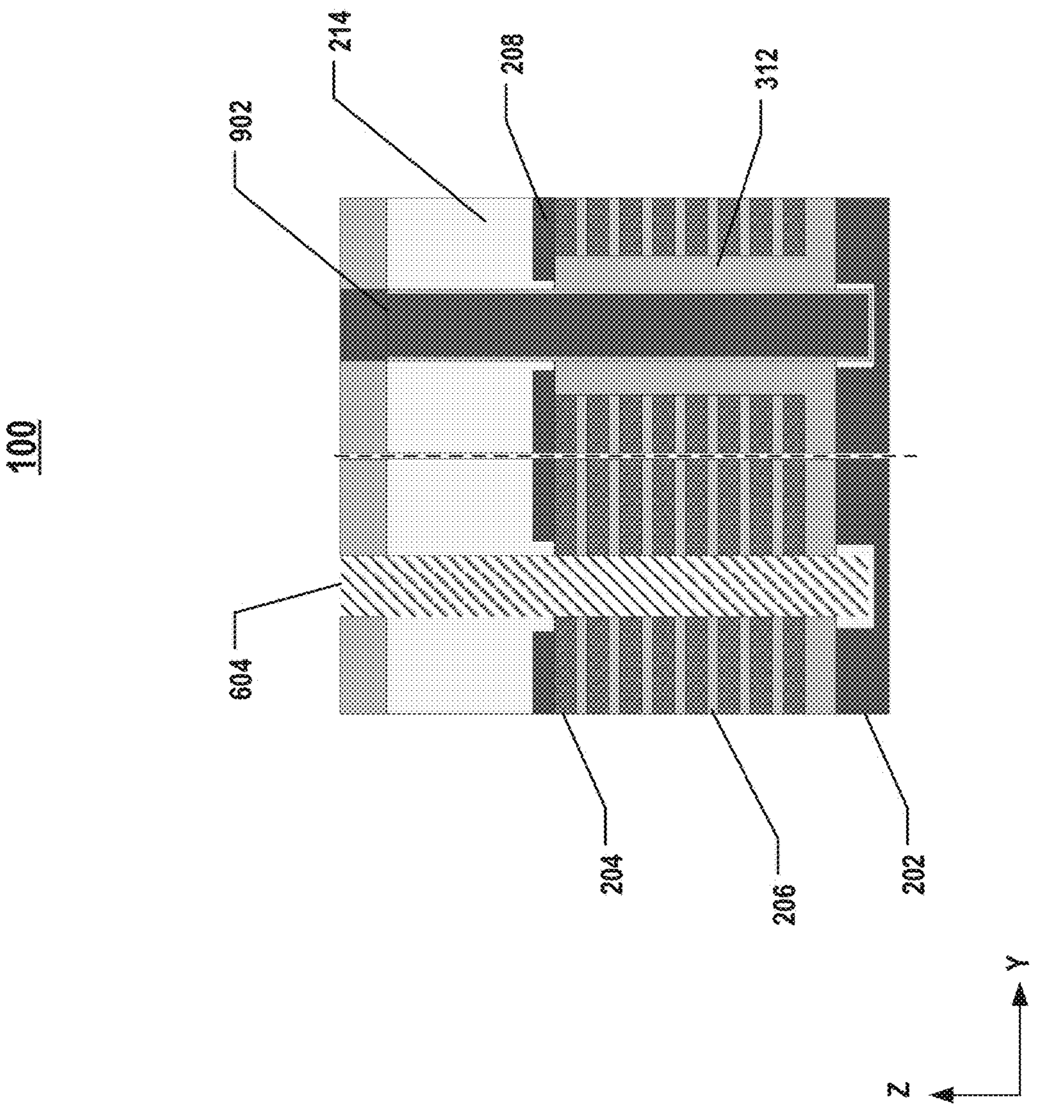

As shown in FIG. 9 and operation 1808 in FIG. 18, a sacrificial structure 902, e.g., a fourth dielectric layer, is formed in first opening 502. In some implementations, sacrificial structure 902 may include one layer or multiple layers of polysilicon. In some implementations, sacrificial structure 902 may be formed in one or multiple deposition operations including, but not limited to, CVD, PVD, ALD, or any combination thereof.

As shown in FIGS. 10-15 and operation 1810 in FIG. 18, first dielectric layers 204 and sacrificial layer 208 are replaced with conductive layers 304 to form a stack having interleaved conductive layers 304 and second dielectric layers 206.

Figure 10:
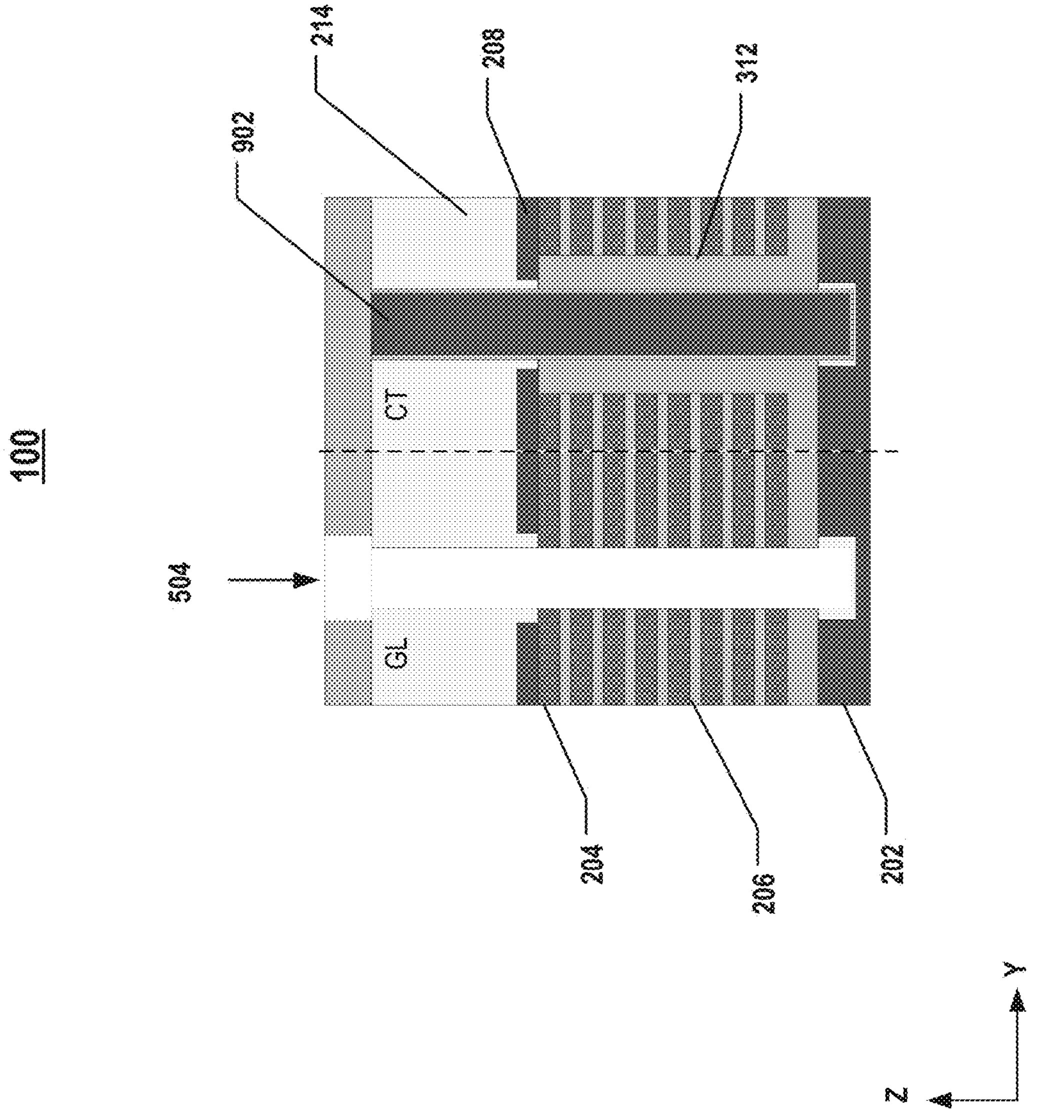
Figure 11:
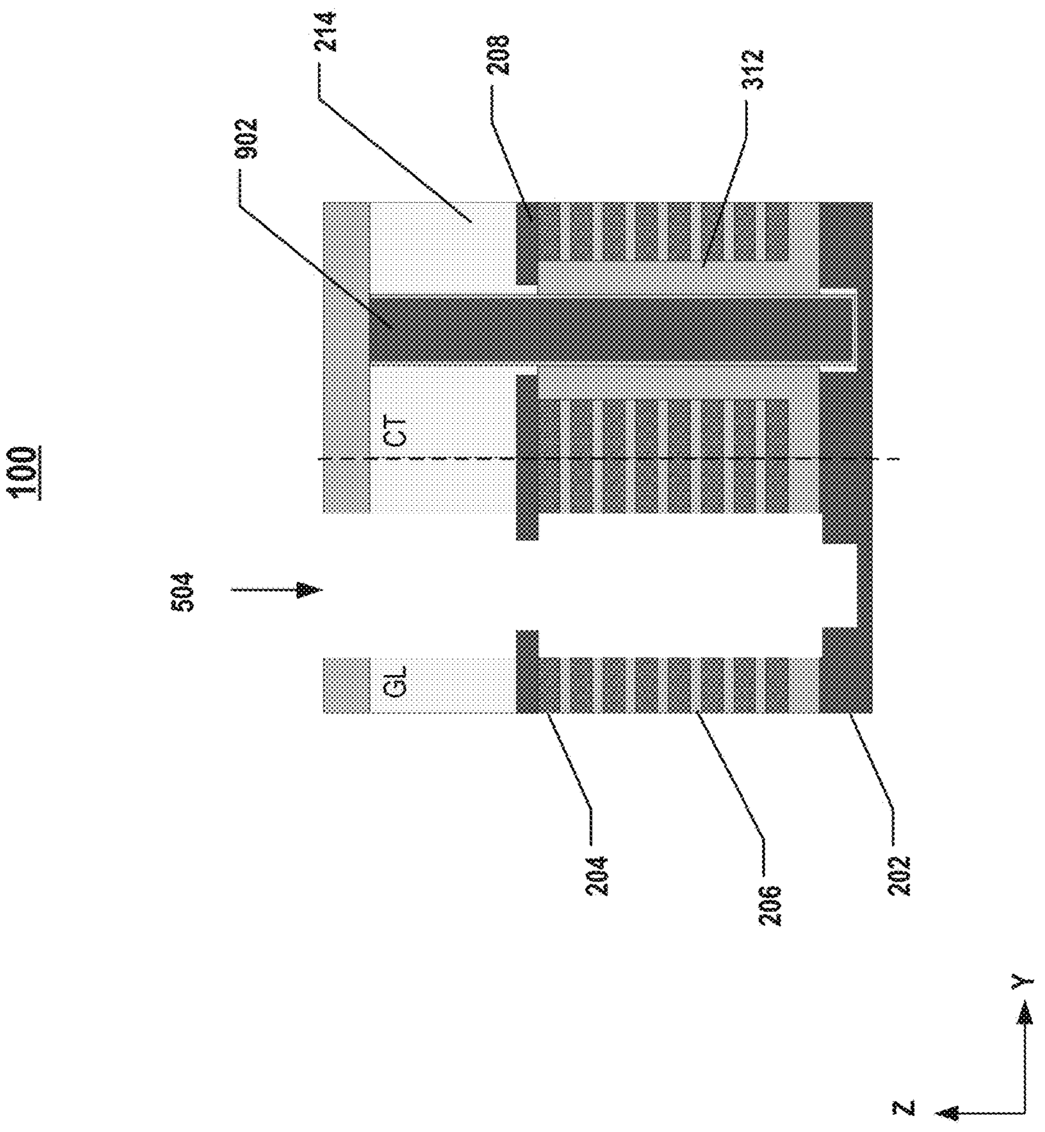

As shown in FIG. 10, second sacrificial filling 604 is removed to expose second opening 504. Then, as shown in FIG. 11, a portion of first dielectric layers 204 and a portion of second dielectric layers 206 are removed along the sidewalls of second opening 504. In other words, second opening 504 may be widened in this operation. In some implementations, the widened second opening 504 may be connected to other widened second opening 504 along the X-direction, and the gate line slit structure 108 formed in the widened second opening 504 in a later operation would be connected to other gate line slit structure 108 along the X-direction in a later operation.

Figure 12:
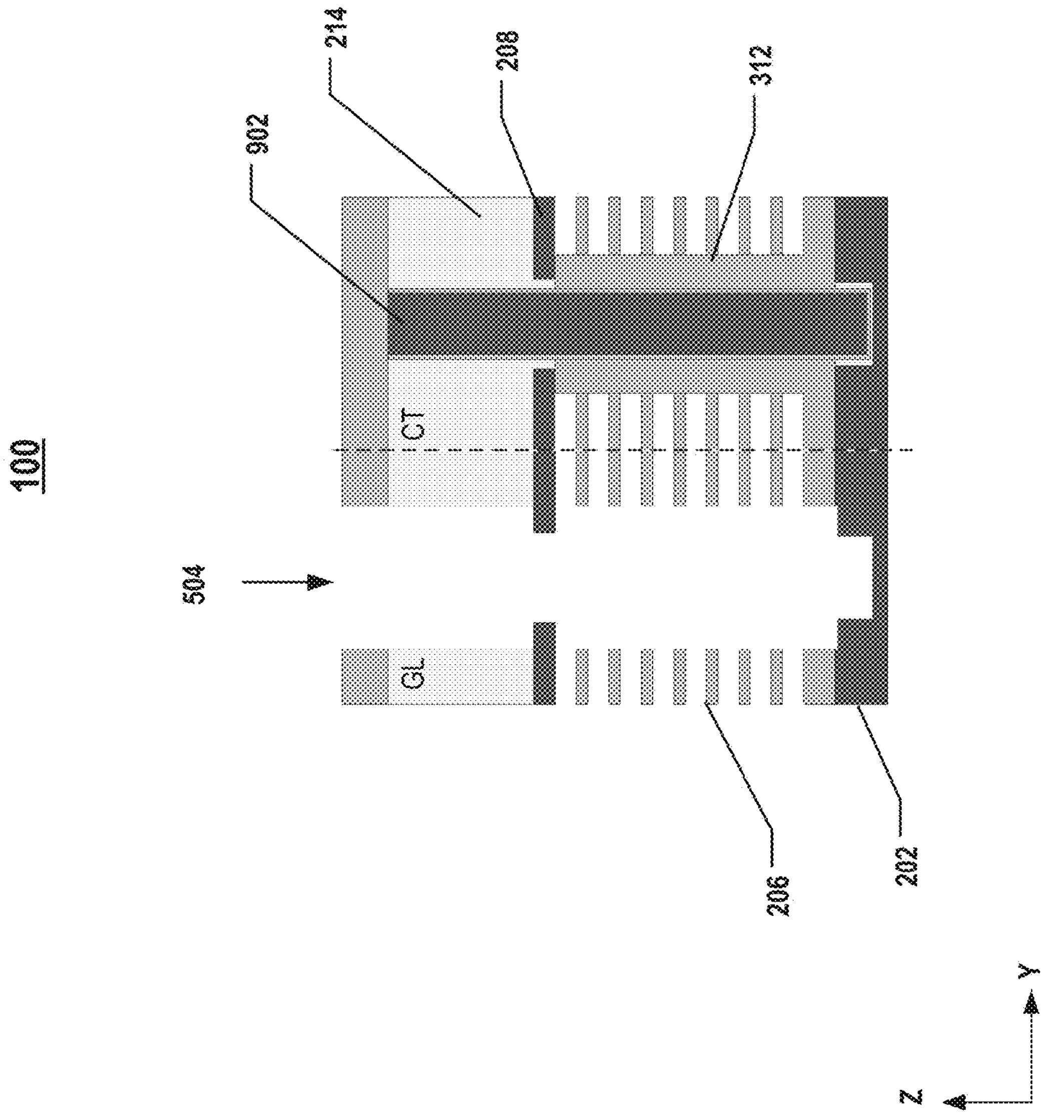
Figure 13:
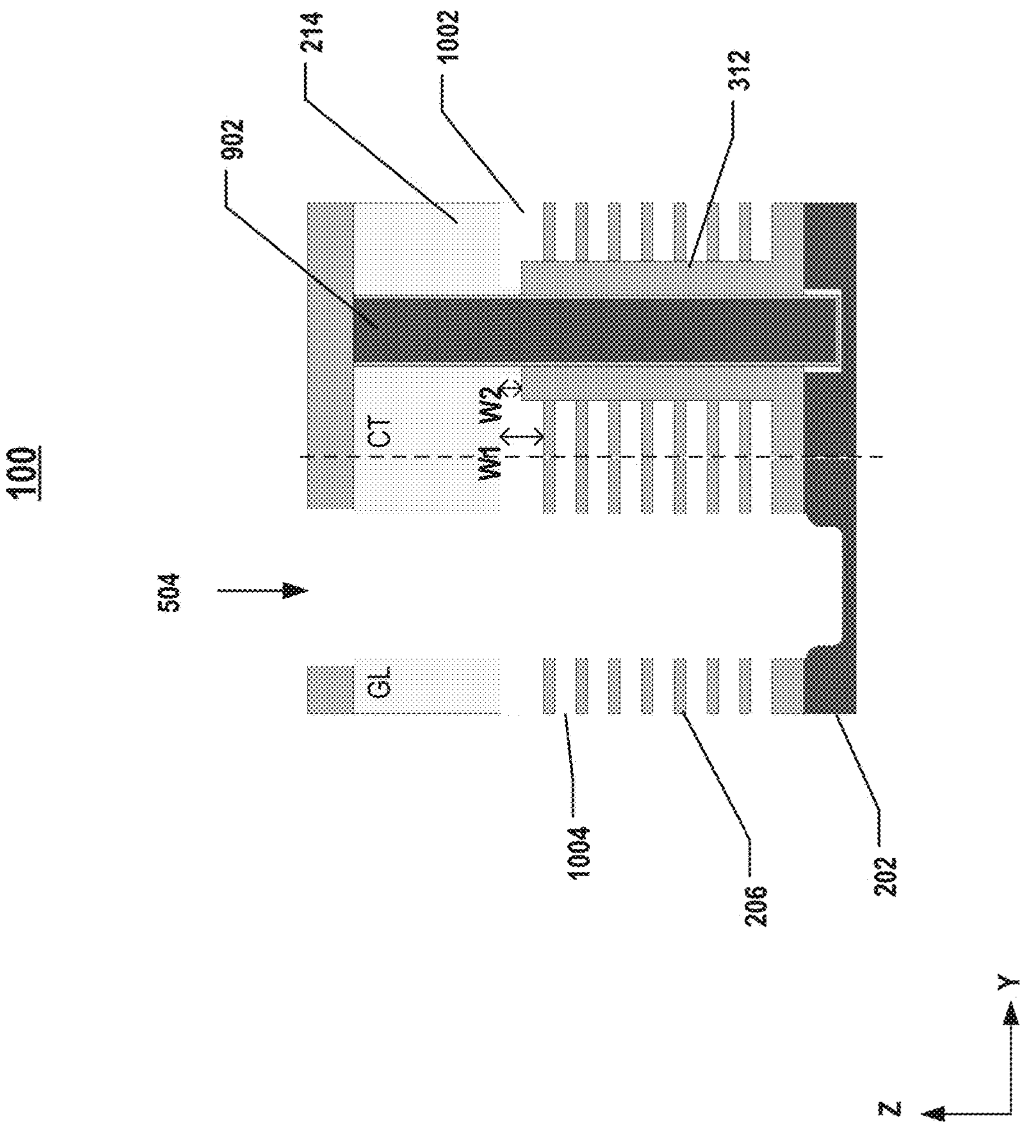

As shown in FIG. 12, first dielectric layers 204 are removed, and as shown in FIG. 13, sacrificial layer 208 is removed. It is understood that first dielectric layers 204 and sacrificial layer 208 may be removed in a same removal operation, e.g., the same etch operation, and first dielectric layers 204 and sacrificial layer 208 may be also removed in multiple removal operations, e.g., multiple etch operations. After removing first dielectric layers 204 and sacrificial layer 208, multiple cavities 1004 are formed between second dielectric layers 206.

As shown in FIG. 13, a topmost cavity 1002 is formed between second dielectric layer 206 and insulating structure 214. In some implementations, topmost cavity 1002 has a first width W1 above second dielectric layer 206 and a second width W2 above spacer layer 312. In some implementations, the first width W1 is greater than the second width W2.

Figure 14:
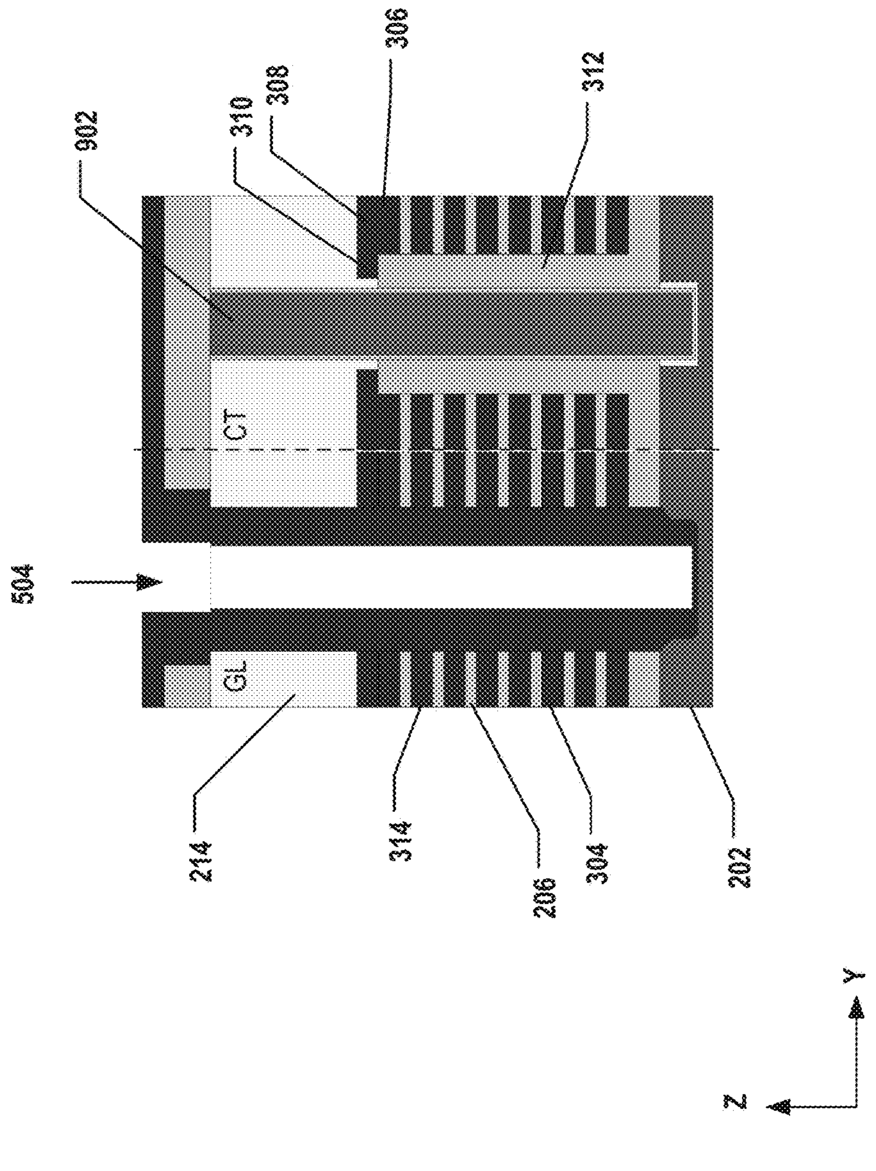

As shown in FIG. 14, conductive layers 304 are formed in topmost cavity 1002 and cavities 1004. Conductive layers 304 may include the topmost conductive layer, e.g., first conductive layer 306, and other conductive layers under the topmost conductive layer, e.g., second conductive layer 314. As shown in FIG. 14, first conductive layer 306 includes a first portion 308 having a first thickness W1 and a second portion 310 having a second thickness W2 less than the first thickness. First portion 308 of first conductive layer 306 is disposed above second dielectric layer 206, and second portion 310 of first conductive layer 306 is disposed above spacer layer 312. Second portion 310 extrudes out first portion 308 along the Y-direction. In some implementations, a top surface of first portion 308 of first conductive layer 306 is coplanar with a top surface of second portion 310 of first conductive layer 306. In some implementations, second conductive layer 314 has a third thickness less than the first thickness of first portion 308.

Figure 15:
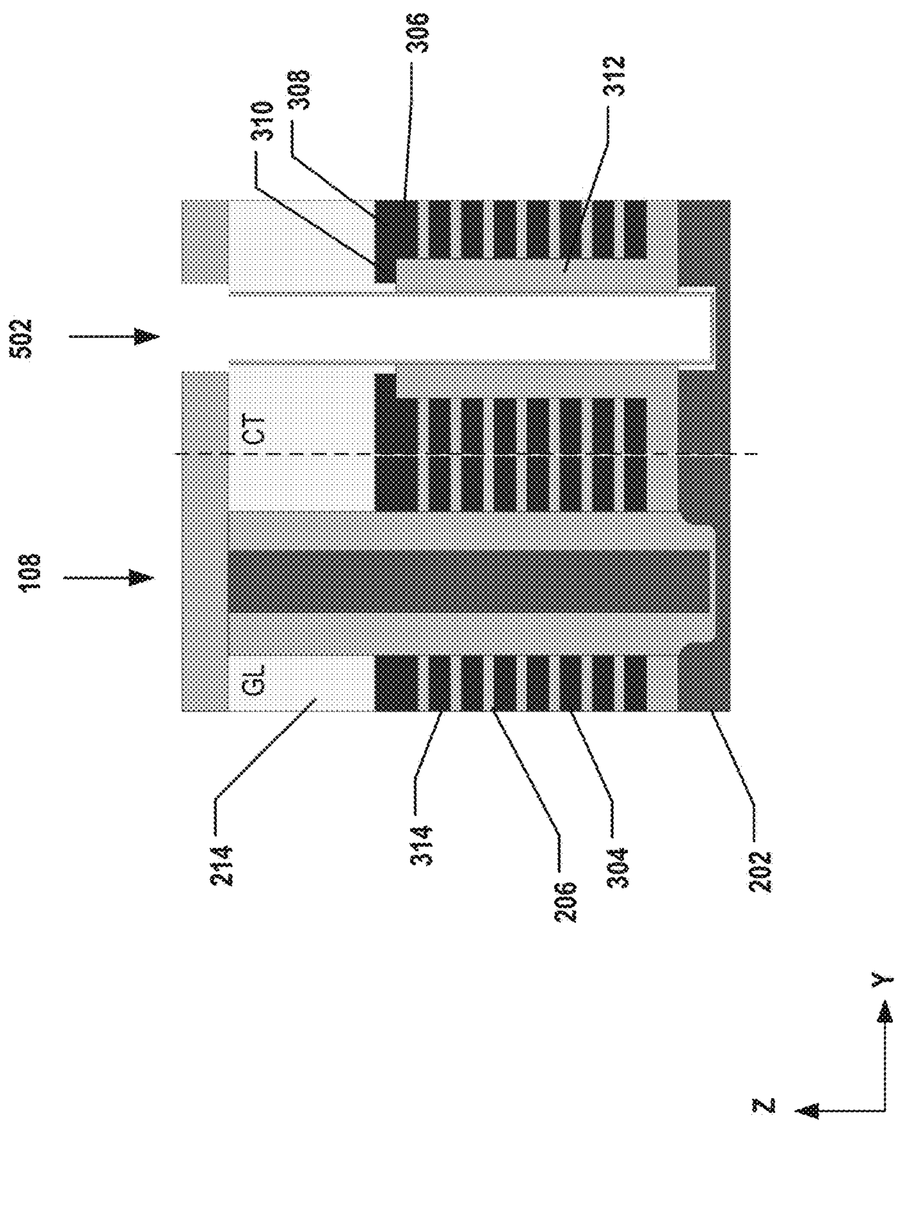

As shown in FIG. 15 and operation 1812 in FIG. 18, gate line slit structure 108 is formed in second opening 504 and sacrificial structure 902 is removed to expose first opening 502. In some implementations, an etch operation is performed to clean the sidewalls of second opening 504 and then gate line slit structure 108 is formed in second opening 504. Because second opening 504 has been widened (shown in FIG. 11) and therefore, in some implementations, gate line slit structure 108 formed in the widened second opening 504 would be connected to other gate line slit structure 108 along the X-direction. In some implementations, sacrificial structure 902 is removed by performing an etch operation to expose first opening 502.

Figure 16:
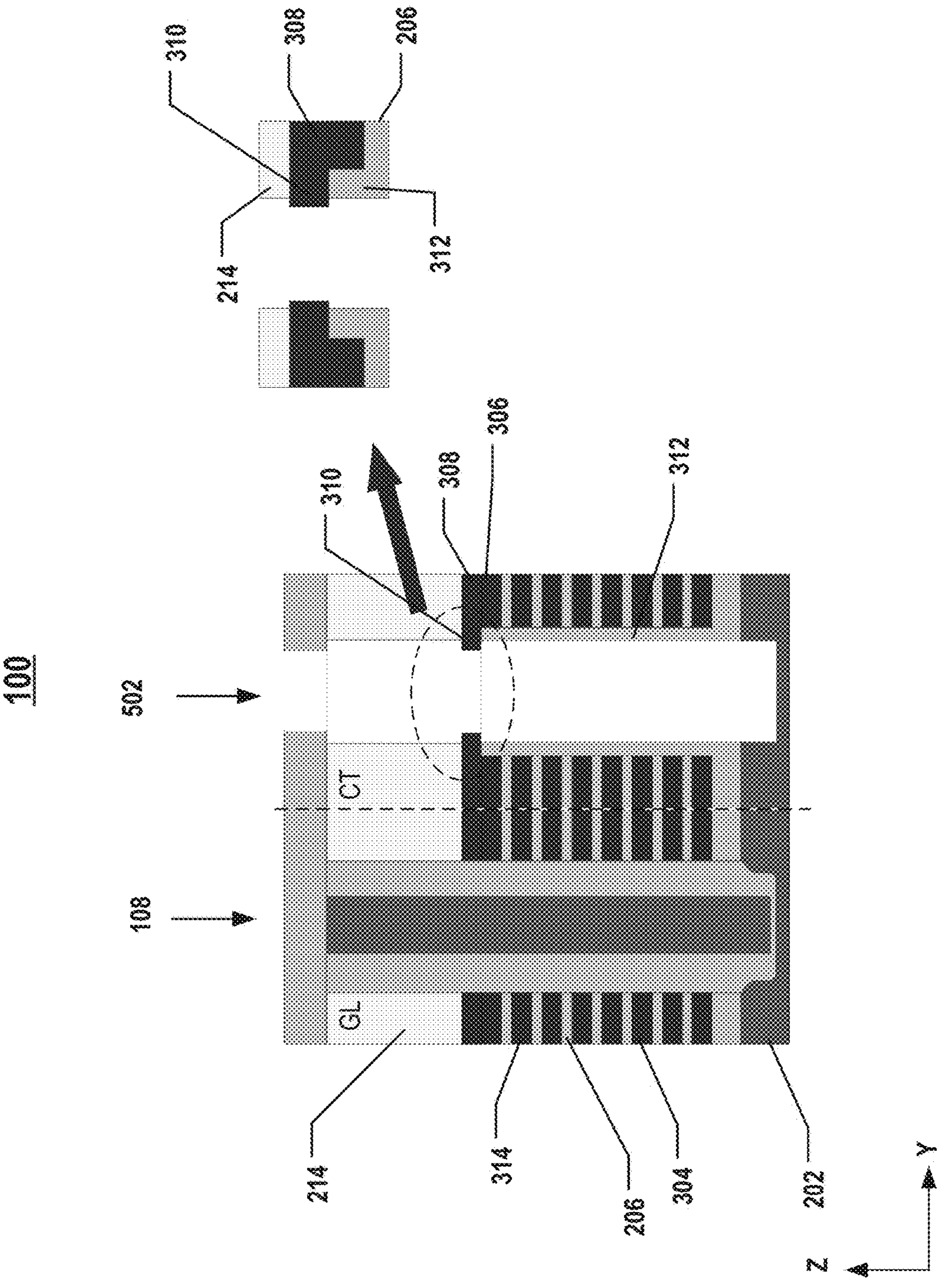

As shown in FIG. 16, a portion of spacer layer 312 along the sidewalls of the first opening is removed to expose first conductive layer 306. In some implementations, a portion of spacer layer 312 and a portion of insulating structure 214 are removed. After the removal process, first conductive layer 306 may extrude out the sidewalls of first opening 502. Specifically, second portion 310 of first conductive layer 306 extrudes out the sidewalls of first opening 502.

Figure 17:
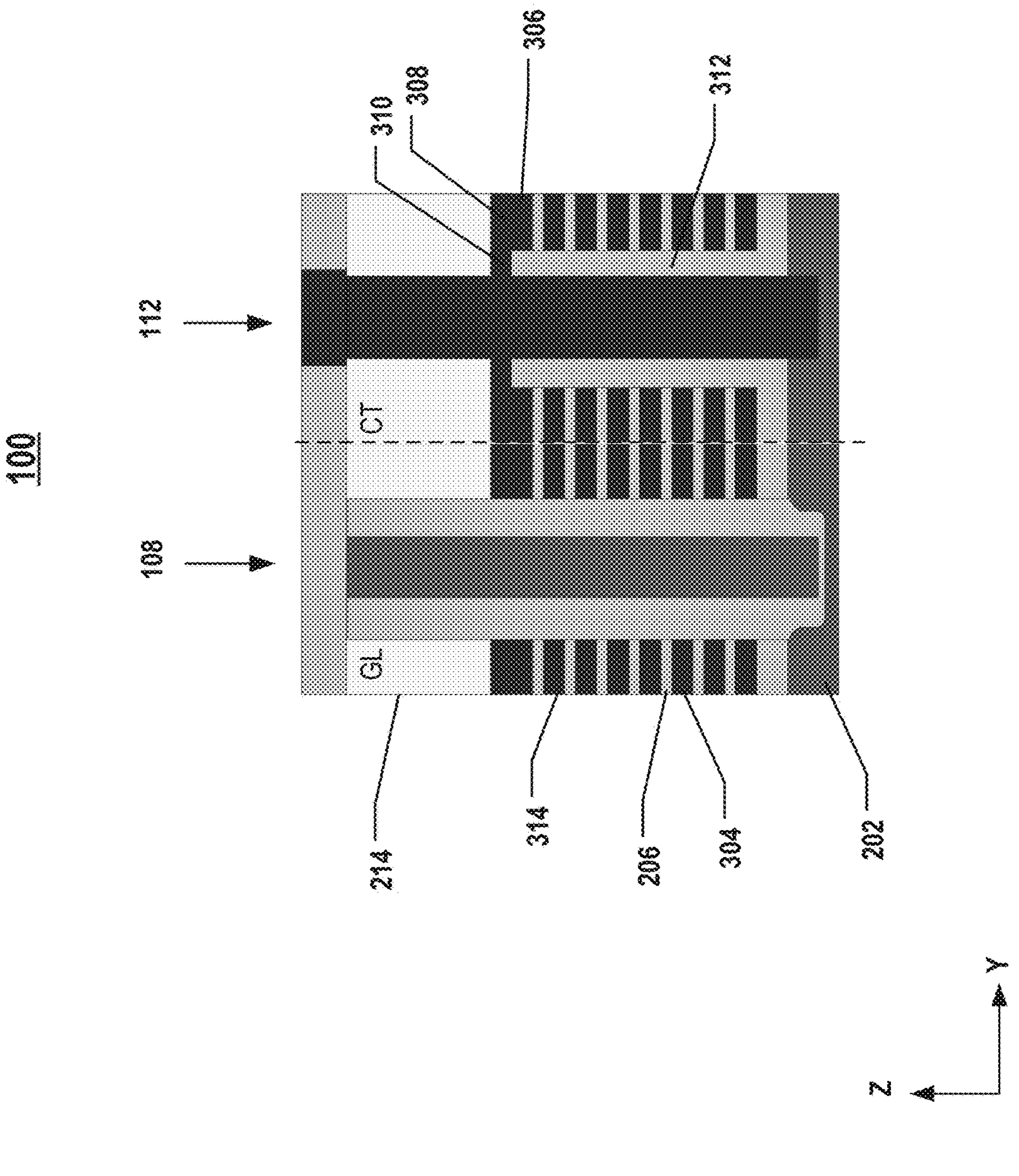
Figure 18:
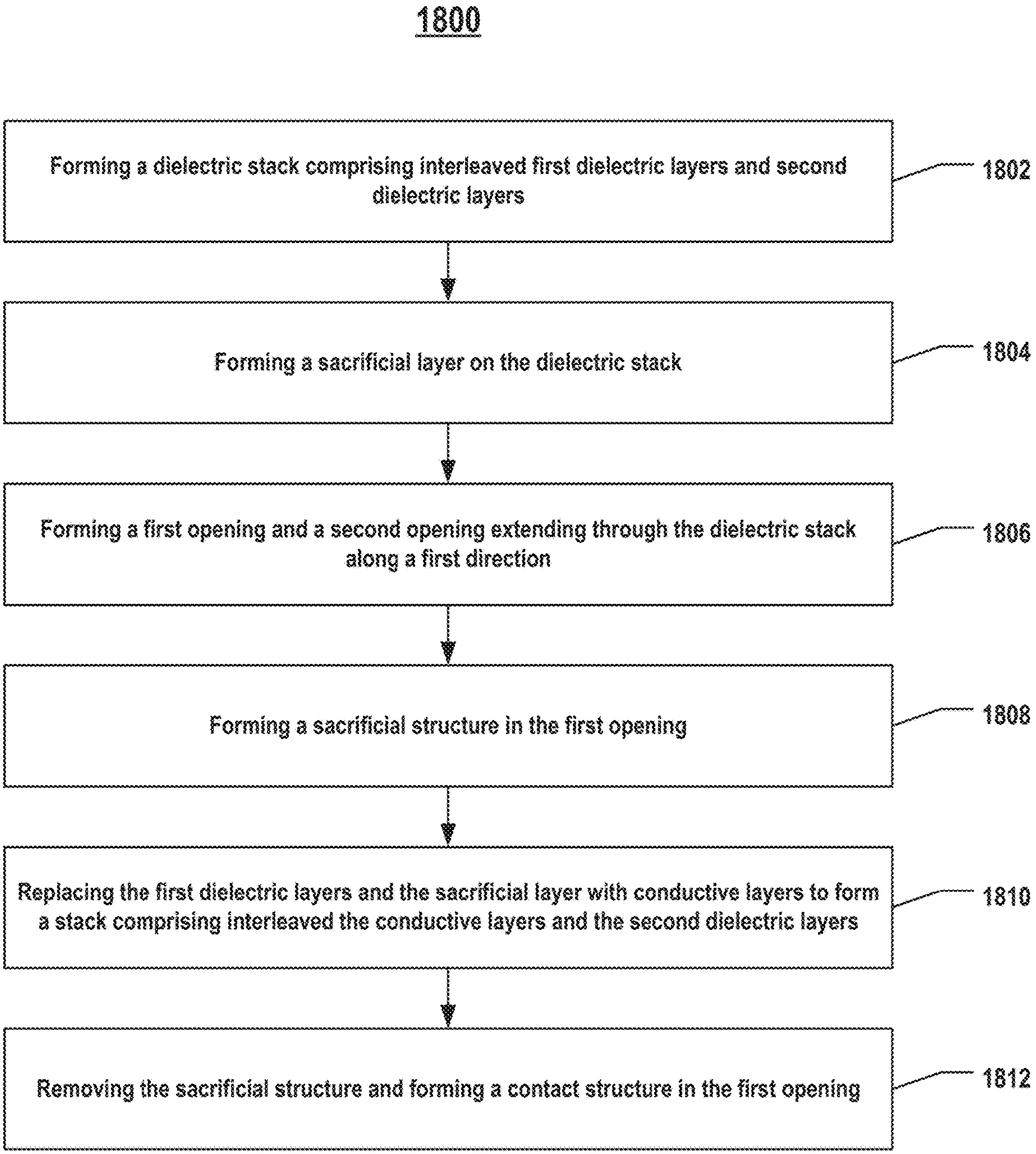
FIG. 18 illustrates a flowchart of a method for forming a memory device, according to some aspects of the present disclosure.

Then, as shown in FIG. 17 and operation 1812 in FIG. 18, contact structure 112 is formed in first opening 502. Contact structure 112 may include conductive materials including, but not limited to, W, Co, Cu, Al, polysilicon, doped silicon, silicides, or any combination thereof. In some implementations, contact structure 112 and conductive layer 304/first conductive layer 306 may be formed by the same material. First conductive layer 306 is in contact with contact structure 112. In some implementations, spacer layer 312 is formed between contact structure 112 and second conductive layer 314. Spacer layer 312 extends along the Z-direction and insulates contact structure 112 and second conductive layer 314. First conductive layer 306 includes first portion 308 having a first thickness and second portion 310 having a second thickness less than the first thickness in contact with contact structure 112. First portion 308 of first conductive layer 306 is disposed above dielectric layer 314, and second portion 310 of first conductive layer 306 is disposed above spacer layer 312.

In other words, first portion 308 of first conductive layer 306 is in contact with second portion 310 of first conductive layer 306, and second portion 310 extrudes out first portion 308 along the Y-direction perpendicular to the Z-direction. In some implementations, a top surface of first portion 308 of first conductive layer 306 is coplanar with a top surface of second portion 310 of first conductive layer 306. In some implementations, second conductive layer 314 has a third thickness less than the first thickness of first portion 308.

By forming contact structure 112, gate line slit structure 108, and/or the channel structure with the above-mentioned process, the photography processes of the channel structure, the gate line slit structure, and the contact structure are merged, and all deep hole etching processes can be completed in a simplified operation. Hence, the manufacturing process can be simplified, and the manufacturing cost can be also reduced.

FIGS. 19-30 illustrate cross-sectional views of a memory device 1900 at various stages of another fabrication process, according to some aspects of the present disclosure. FIG. 31 illustrates a flowchart of a method 3100 for forming memory device 1900, according to some aspects of the present disclosure. For the purpose of better describing the present disclosure, the memory device 1900 in FIGS. 19-30 and method 3100 in FIG. 31 will be discussed together. It is understood that the operations shown in method 3100 are not exhaustive and that other operations may be performed as well before, after, or between any of the illustrated operations. Further, some of the operations may be performed simultaneously, or in a different order than shown in FIGS. 19-30 and FIG. 31.

FIGS. 3-5 illustrate some cross-sectional views of memory device 1900 when performing method 3100. As shown in FIG. 3 and operation 3102 in FIG. 31, a dielectric stack is formed on semiconductor layer 202. FIG. 3 illustrates a cross-sectional view of the memory device along line AA' in FIG. 1. The dielectric stack includes interleaved first dielectric layers 204 and second dielectric layers 206. In some implementations, semiconductor layer 202 may include a doped or undoped polysilicon layer. In some implementations, the dielectric layer pairs, including first dielectric layers 204 and second dielectric layers 206, may extend along the X-direction and the Y-direction. In some implementations, each first dielectric layer 204 may include a layer of silicon nitride, and each second dielectric layer 206 may include a layer of silicon oxide. The dielectric layer pairs may be formed by one or more thin film deposition processes including, but not limited to, CVD, PVD, ALD, or any combination thereof.

Then, a staircase structure 210 is formed at the outer region of the dielectric stack. In some implementations, the outer region of the dielectric stack may include multiple staircase structures. The corresponding edges of the dielectric stack along the vertical direction away from the bottom of the dielectric stack (the positive Z-direction) can be staggered laterally toward cell region 102. In other words, the edges of the dielectric stack in staircase structure 210 can be tilted toward the inner region of the dielectric stack. In some implementations, the length of the dielectric layer pairs increases from the top to the bottom.

In some implementations, the top layer in each level of staircase structure 210 (e.g., each dielectric layer pair) is first dielectric layer 204. After first dielectric layer 204 is replaced by the conductive layers in the later operations, staircase structure 210 may be the word line fan-out. In some implementations, the formation of staircase structure 210 may include multiple etch operations.

As shown in FIG. 3 and operation 3104 in FIG. 31, a sacrificial layer 208 is formed on the dielectric stack. After exposing the plurality of first dielectric layers 204 at the outer region of the dielectric stack, sacrificial layer 208 is formed on each first dielectric layer 204 at the outer region of the dielectric stack. In some implementations, sacrificial layer 208 may include a polysilicon layer. Then, staircase structure 210 is covered by insulating structure 214.

As shown in FIG. 4, FIG. 5, and operation 3106 in FIG. 31, a first opening 502 and a second opening 504 are formed in the dielectric stack and extend through the dielectric stack along the Z-direction. FIG. 4 shows the cross-sectional view of the memory device along line AA' in FIG. 1, so only first opening 502 could be seen in FIG. 4.

In some implementations, an etch operation or multiple etch operations may be performed to remove portions of the dielectric stack to form first opening 502 and second opening 504 together. In some implementations, insulating structure 214, sacrificial layer 208, first dielectric layer 204, and second dielectric layer 206 are removed to form first opening 502 and second opening 504 together. As shown in FIG. 5, first opening 502 and second opening 504 may have a same depth extending to semiconductor layer 202. In some implementations, first opening 502, second opening 504, and channel structure openings (not shown) may be formed together in the same etch operations, and first opening 502, second opening 504, and channel structure openings may have the same depth extending to semiconductor layer 202. By forming first opening 502, second opening 504, and channel structure openings together, the process steps could be significantly reduced, and the manufacturing cost could be also lowered.

Figure 19:
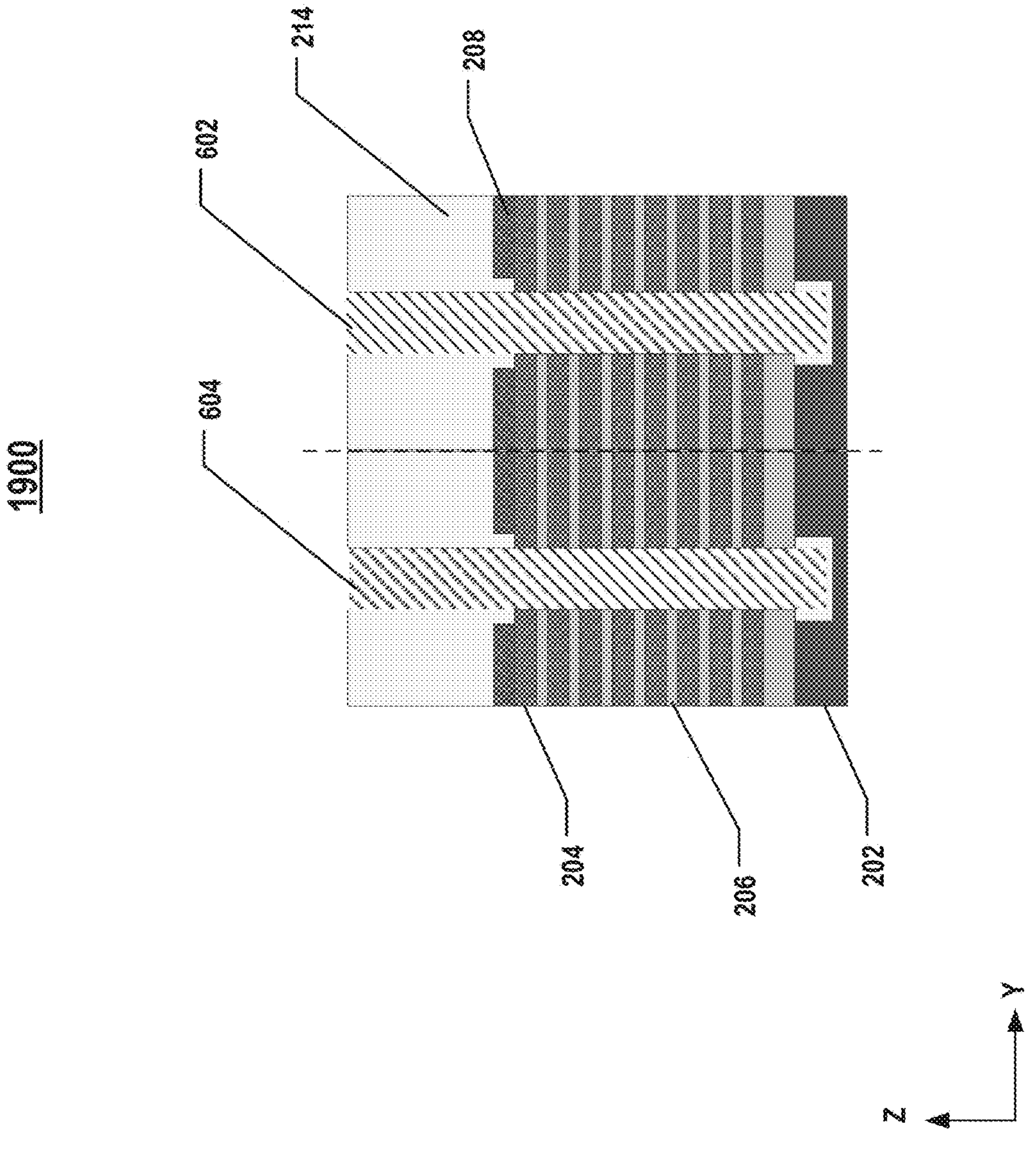
FIGS. 19-30 illustrate cross-sectional views of the memory device at various stages of another fabrication process, according to some aspects of the present disclosure.

As shown in FIG. 19 after forming first opening 502 and second opening 504, a first sacrificial filling 602 is formed in first opening 502, and a second sacrificial filling 604 is formed in second opening 504. In some implementations, first sacrificial filling 602 and second sacrificial filling 604 are formed in first opening 502 and second opening 504 together in a same deposition process.

Figure 20:
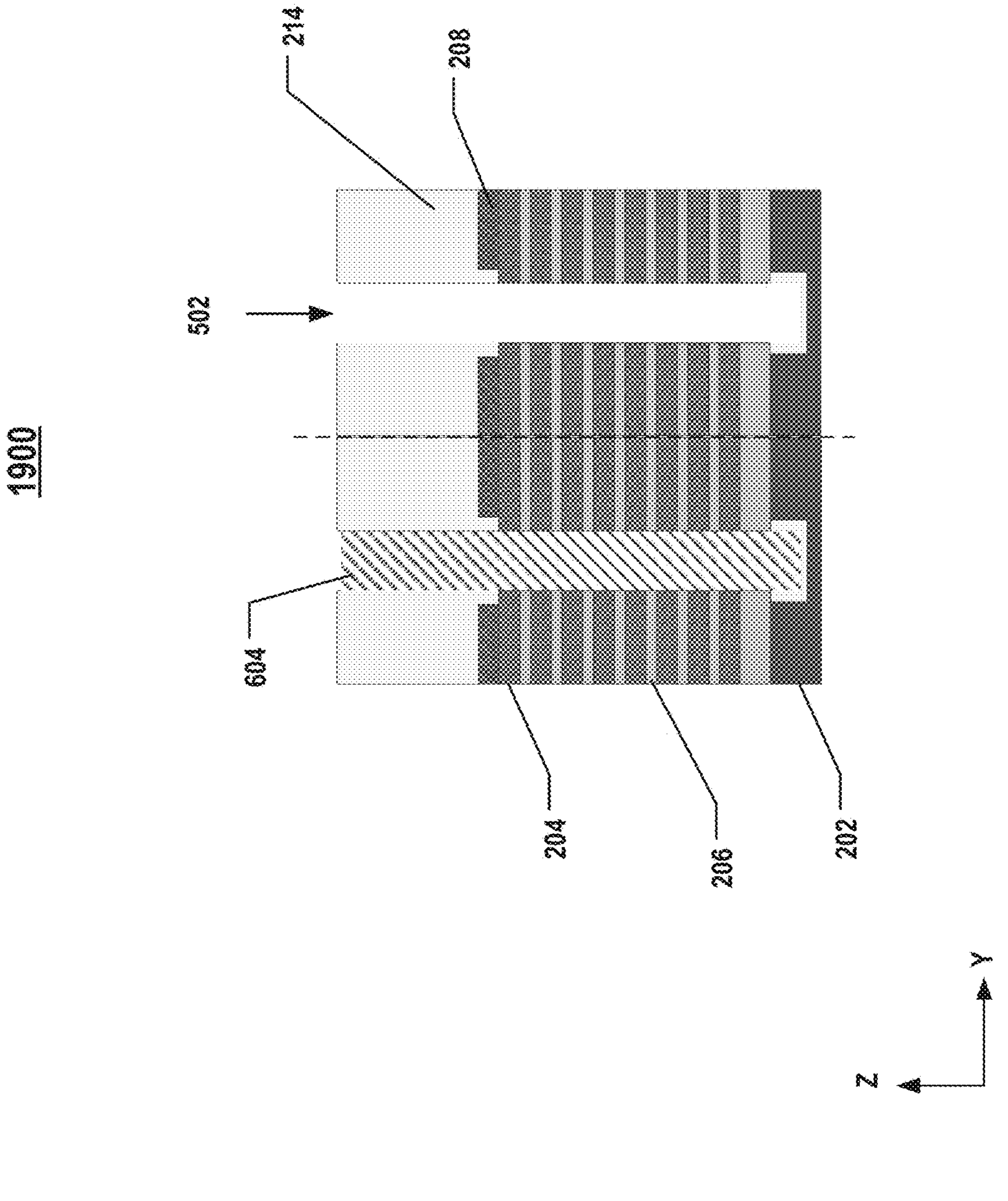
Figure 21:
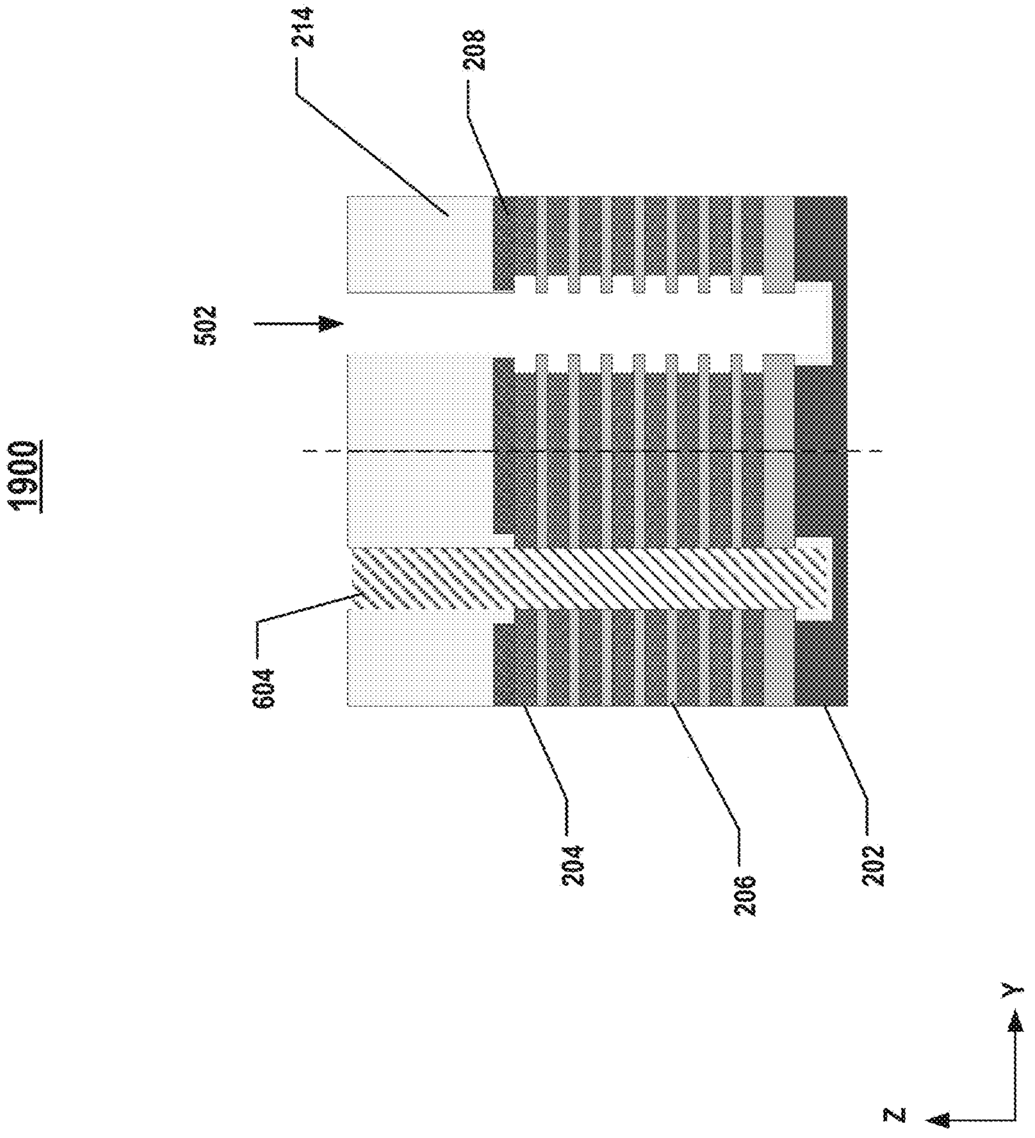

Then, as shown in FIG. 20, first sacrificial filling 602 may be removed to expose first opening 502. In some implementations, in the operation of removing first sacrificial filling 602, portions of first dielectric layer 204 may be also removed. In other words, sacrificial layer 208 may extrude along the sidewalls of first opening 502, as shown in FIG. 21. The extruding structure of sacrificial layer 208 may form a specific shape of the topmost conductive layer in a later operation.

Figure 22:
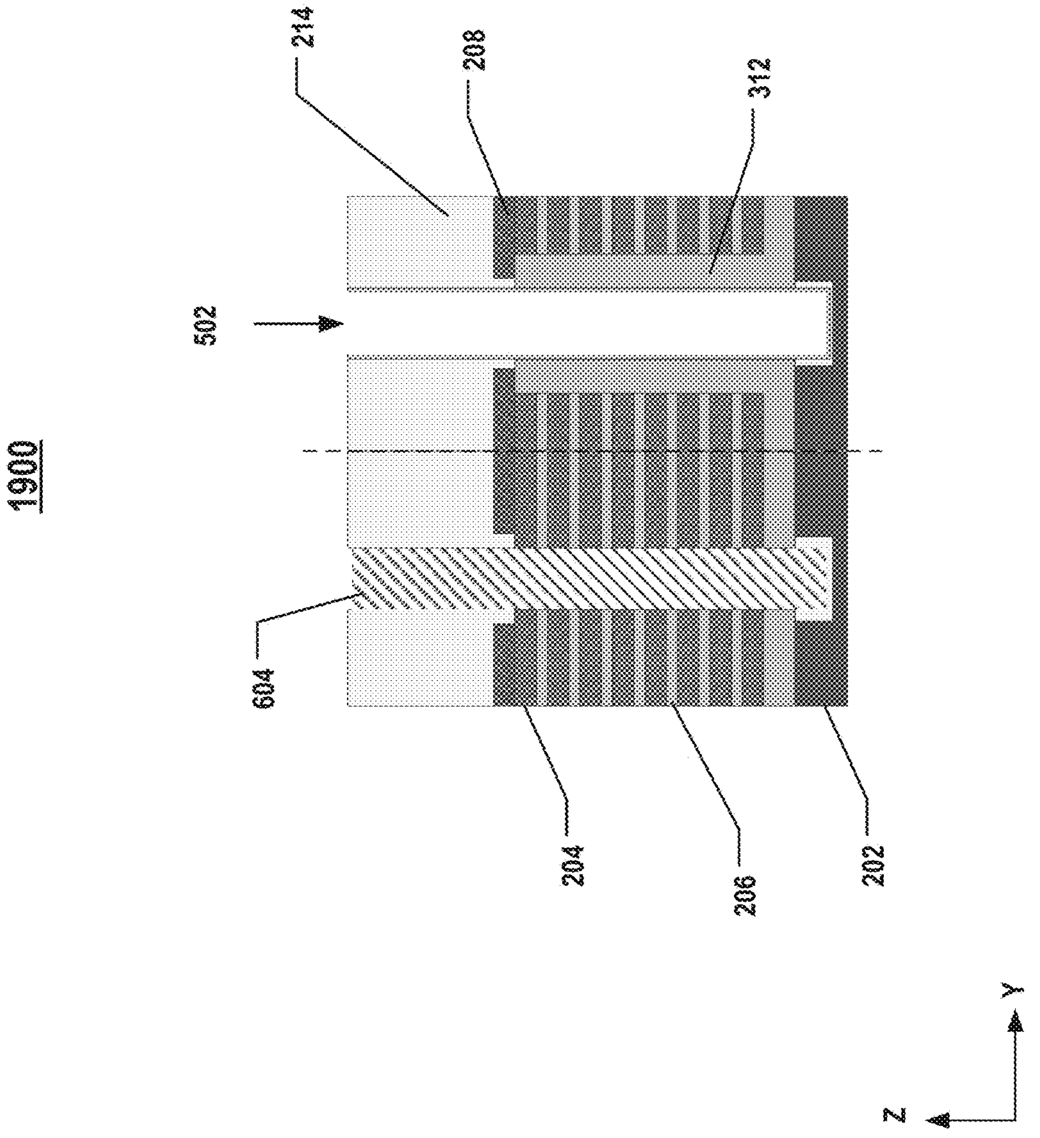

As shown in FIG. 22, spacer layer 312 is formed on the sidewalls of first opening 502. In some implementations, spacer layer 312 may include silicon oxide. After forming spacer layer 312 on the sidewalls of first opening 502, a portion of sacrificial layer 208 is above spacer layer 312, as shown in FIG. 22. In other words, the extruding structure of sacrificial layer 208 may cover the top surface of spacer layer 312.

Figure 23:
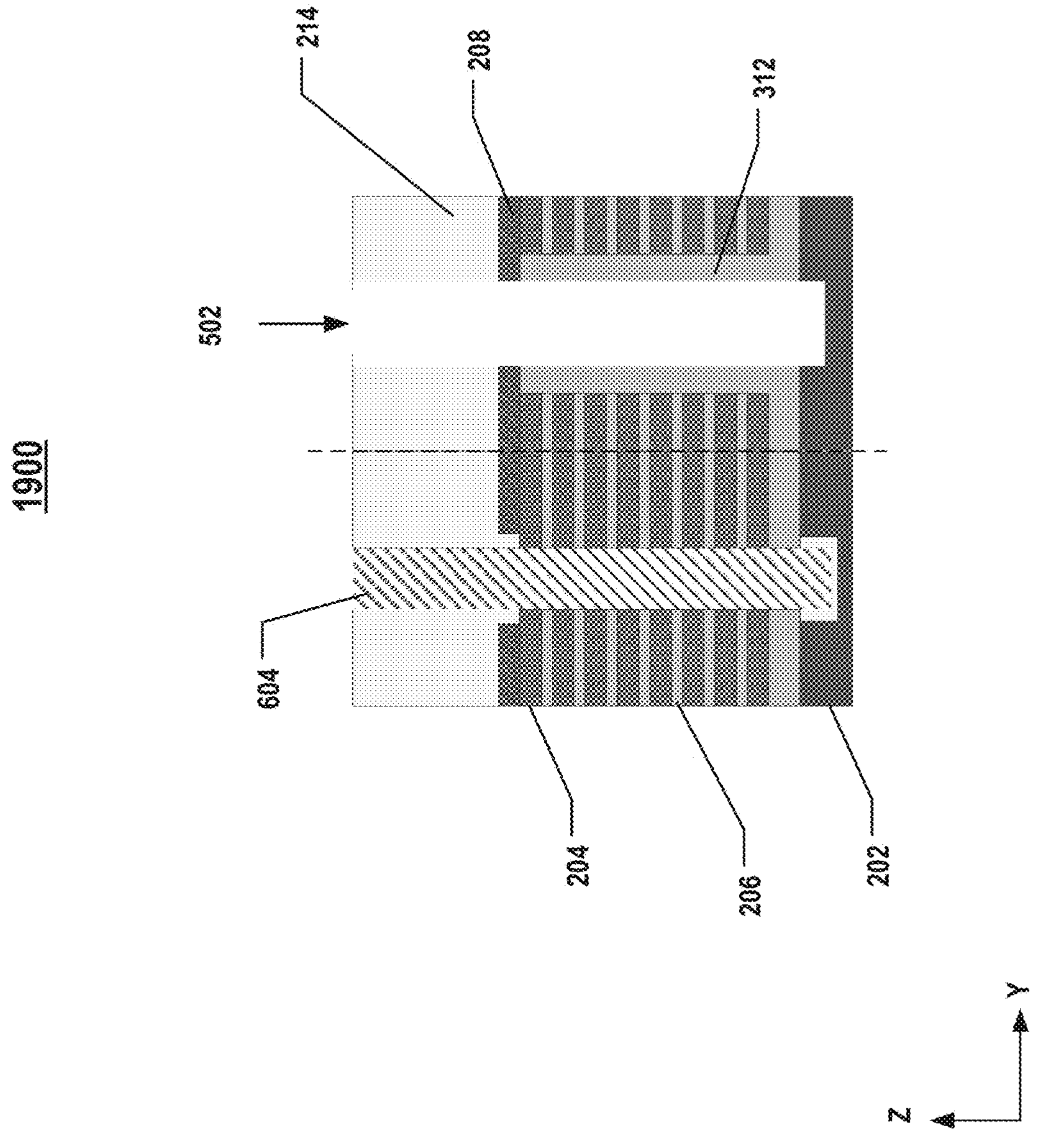

As shown in FIG. 23, a removal operation is performed on the sidewalls of first opening 502 to expose sacrificial layer 208. In some implementations, a portion of spacer layer 312 and a portion of insulating structure 214 are removed. In some implementations, sacrificial layer 208 is exposed on the sidewalls of first opening 502 after the removal operation.

Figure 24:
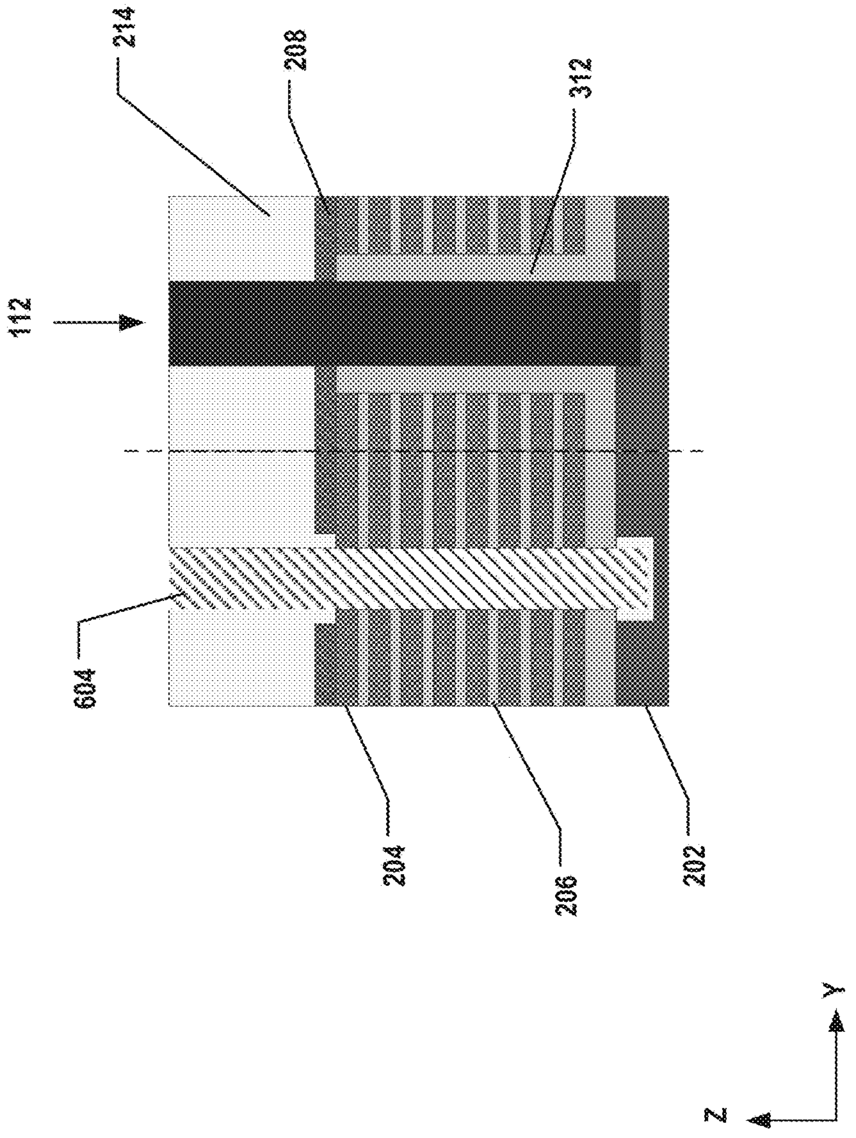

As shown in FIG. 24 and operation 3108 in FIG. 31, contact structure 112 is formed in first opening 502. Contact structure 112 may include conductive materials including, but not limited to, W, Co, Cu, Al, polysilicon, doped silicon, silicides, or any combination thereof.

Figure 25:
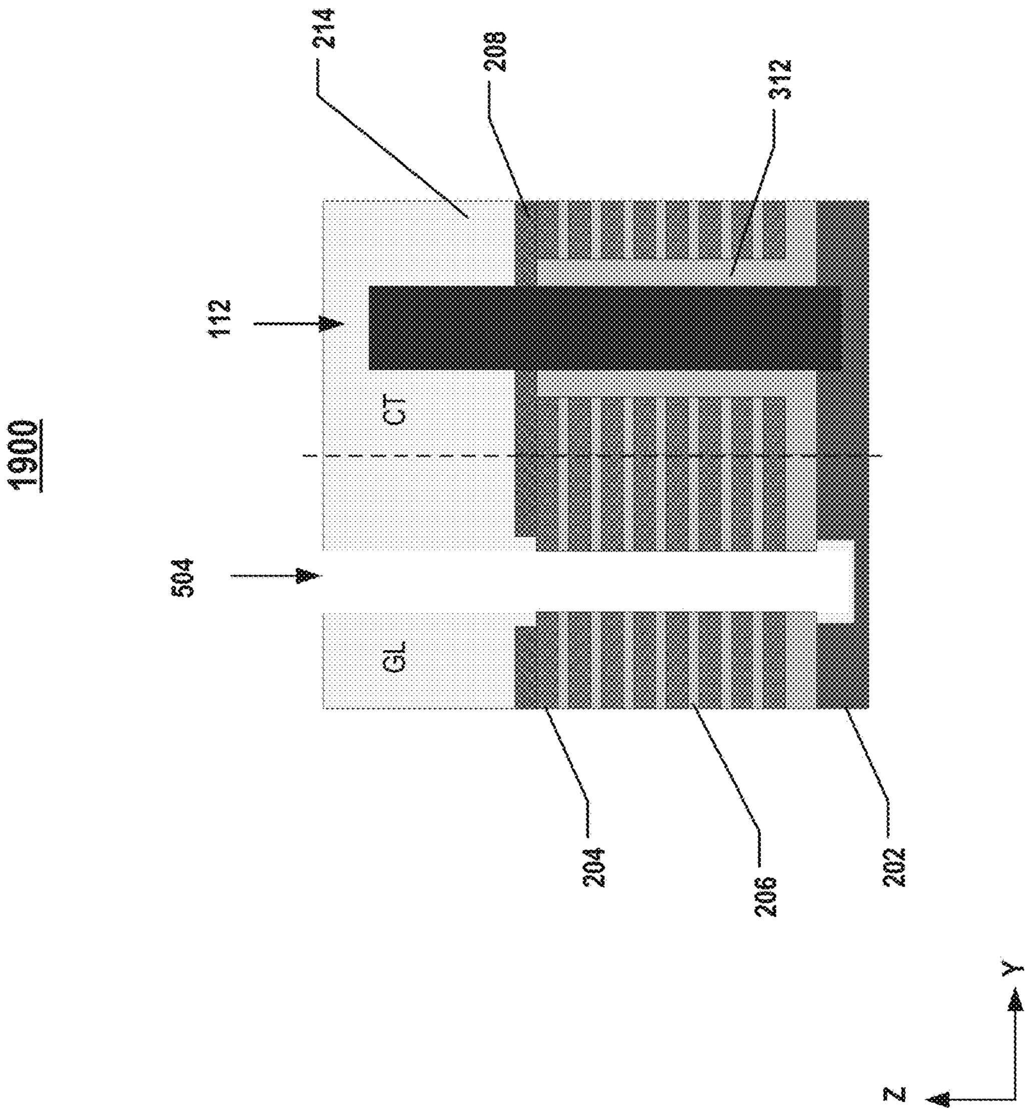
Figure 26:
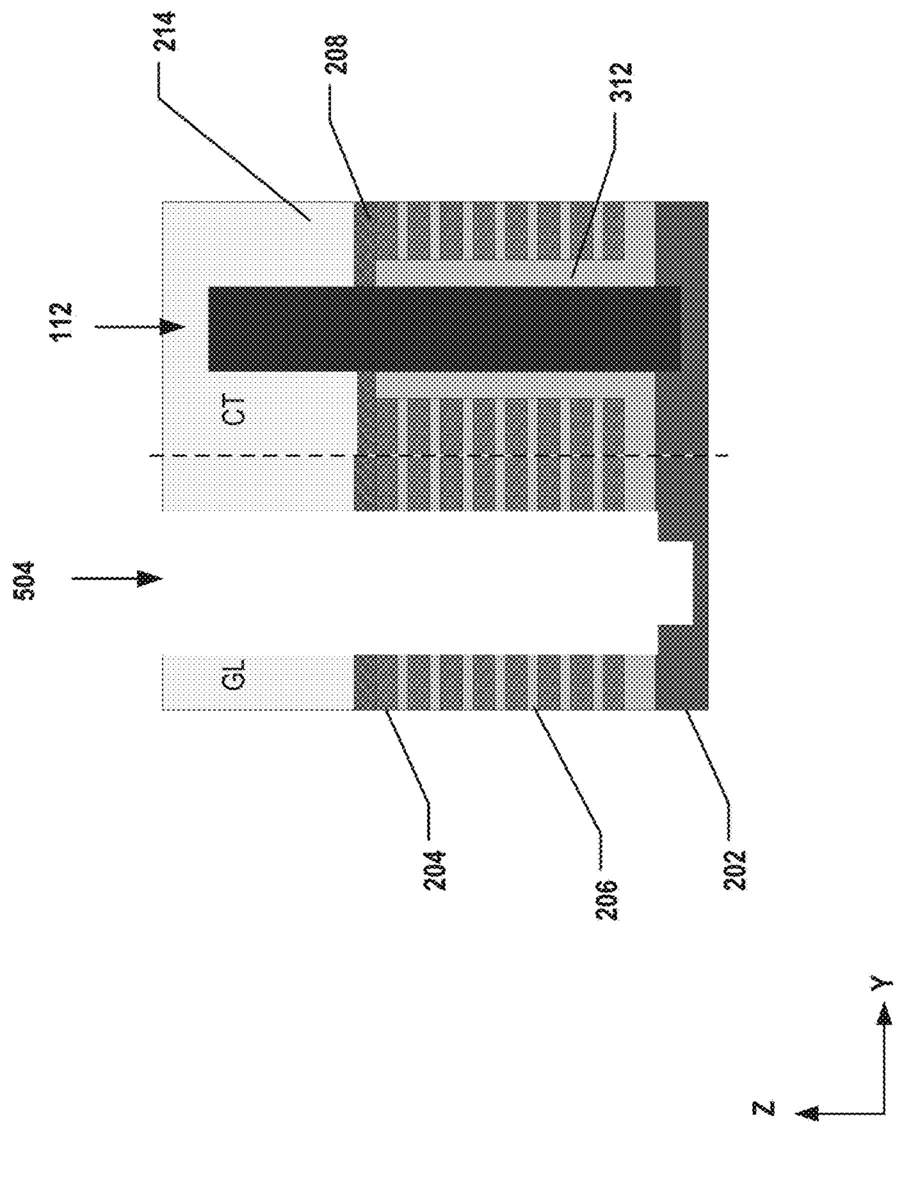

As shown in FIGS. 25-26 and operation 3110 in FIG. 31, a removal operation is performed in second opening 504 to widen second opening 504. As shown in FIG. 25, second sacrificial filling 604 is removed to expose second opening 504. Then, as shown in FIG. 26, a portion of first dielectric layers 204, a portion of second dielectric layers 206, a portion of sacrificial layer 208, and a portion of insulating structure 214 are removed along the sidewalls of second opening 504. In other words, second opening 504 may be widened in this operation. In some implementations, the widened second opening 504 may be connected to other widened second opening 504 along the X-direction, and the gate line slit structure 108 formed in the widened second opening 504 in a later operation would be connected to other gate line slit structure 108 along the X-direction in a later operation.

Figure 27:
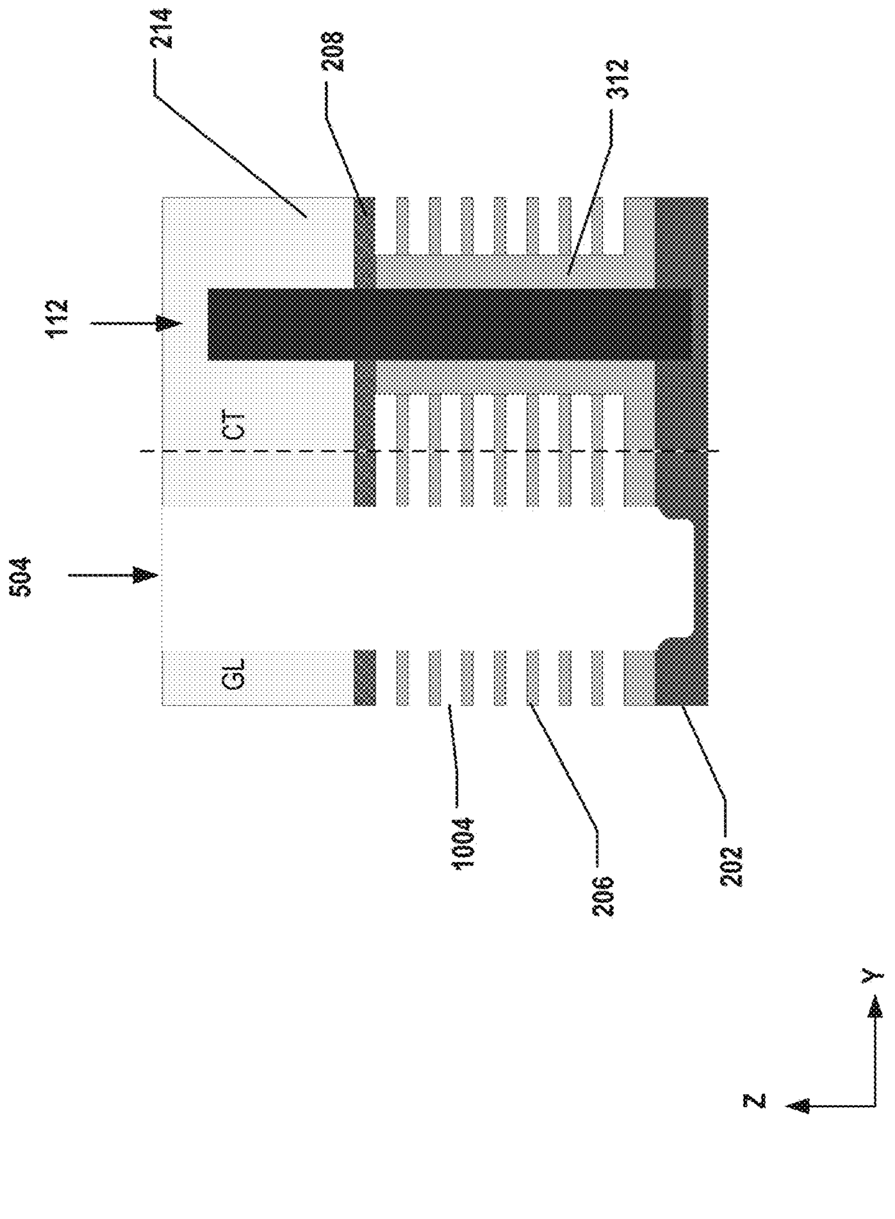
Figure 28:
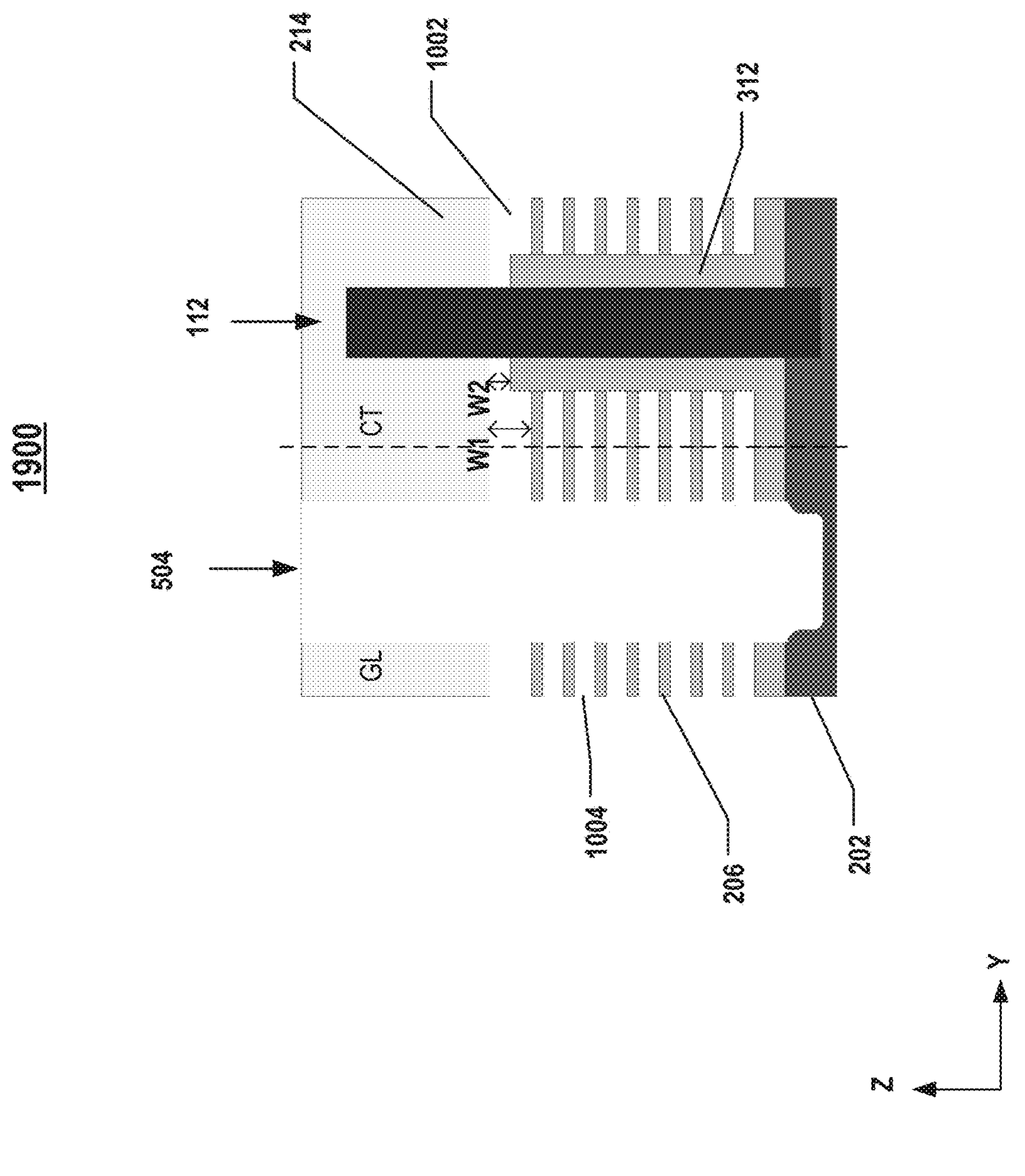
Figure 29:
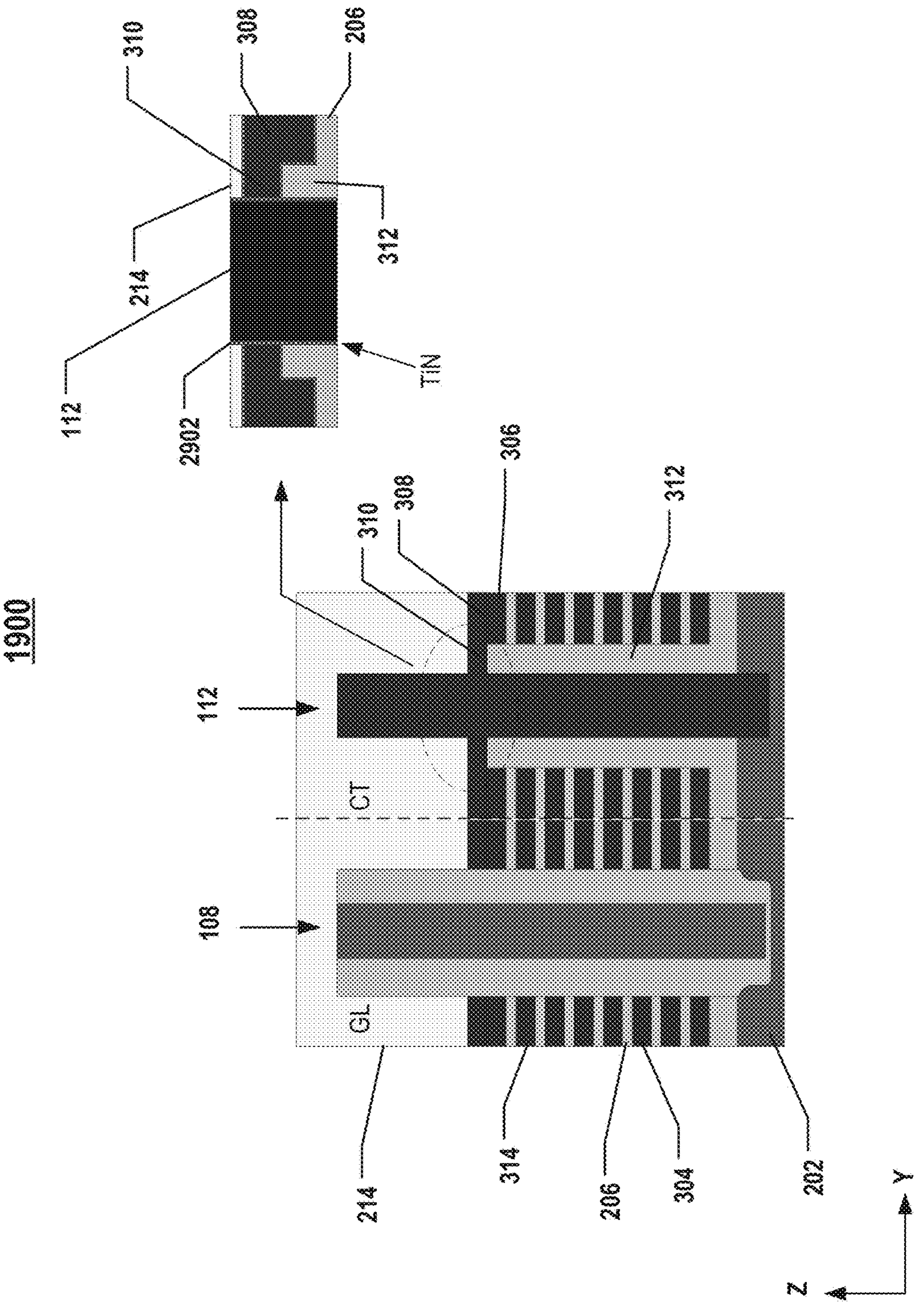

As shown in FIGS. 27-29 and operation 3112 in FIG. 31, first dielectric layers 204 and sacrificial layer 208 are replaced with conductive layers 304 to form a stack having interleaved conductive layers 304 and second dielectric layers 206.

As shown in FIG. 27, first dielectric layers 204 are removed, and as shown in FIG. 28, sacrificial layer 208 is removed. It is understood that first dielectric layers 204 and sacrificial layer 208 may be removed in a same removal operation, e.g., the same etch operation, and first dielectric layers 204 and sacrificial layer 208 may be also removed in multiple removal operations, e.g., multiple etch operations. After removing first dielectric layers 204 and sacrificial layer 208, multiple cavities 1004 are formed between second dielectric layers 206.

As shown in FIG. 28, a topmost cavity 1002 is formed between second dielectric layer 206 and insulating structure 214. In some implementations, topmost cavity 1002 has a first width W1 above second dielectric layer 206 and a second width W2 above spacer layer 312. In some implementations, the first width W1 is greater than the second width W2.

As shown in FIG. 29, conductive layers 304 are formed in topmost cavity 1002 and cavities 1004. Conductive layers 304 may include the topmost conductive layer, e.g., first conductive layer 306, and other conductive layers under the topmost conductive layer, e.g., second conductive layer 314. As shown in FIG. 29, first conductive layer 306 includes a first portion 308 having a first thickness W1 and a second portion 310 having a second thickness W2 less than the first thickness. First portion 308 of first conductive layer 306 is disposed above second dielectric layer 206, and second portion 310 of first conductive layer 306 is disposed above spacer layer 312. Second portion 310 extrudes out first portion 308 along the Y-direction. In some implementations, a top surface of first portion 308 of first conductive layer 306 is coplanar with a top surface of second portion 310 of first conductive layer 306. In some implementations, second conductive layer 314 has a third thickness less than the first thickness of first portion 308.

As shown in FIG. 29 and operation 3114 in FIG. 31, gate line slit structure 108 is formed in second opening 504. In some implementations, an etch operation is performed to clean the sidewalls of second opening 504 and then gate line slit structure 108 is formed in second opening 504. Because second opening 504 has been widened (shown in FIG. 26) and therefore, in some implementations, gate line slit structure 108 formed in the widened second opening 504 would be connected to other gate line slit structure 108 along the X-direction. In some implementations, sacrificial structure 902 is removed by performing an etch operation to expose first opening 502.

As shown in FIG. 29, an adhesive layer 2902 may be formed between contact structure 112 and spacer layer 312, between first conductive layer 306 and contact structure 112, and between first conductive layer 306 and second dielectric layer 206. In some implementations, adhesive layer 2902 may include TiN. Because contact structure 112 is formed first and first conductive layer 306, including first portion 308 and second portion 310, is formed later, adhesive layer 2902 may be formed between first conductive layer 306 and contact structure 112.

Figure 30:
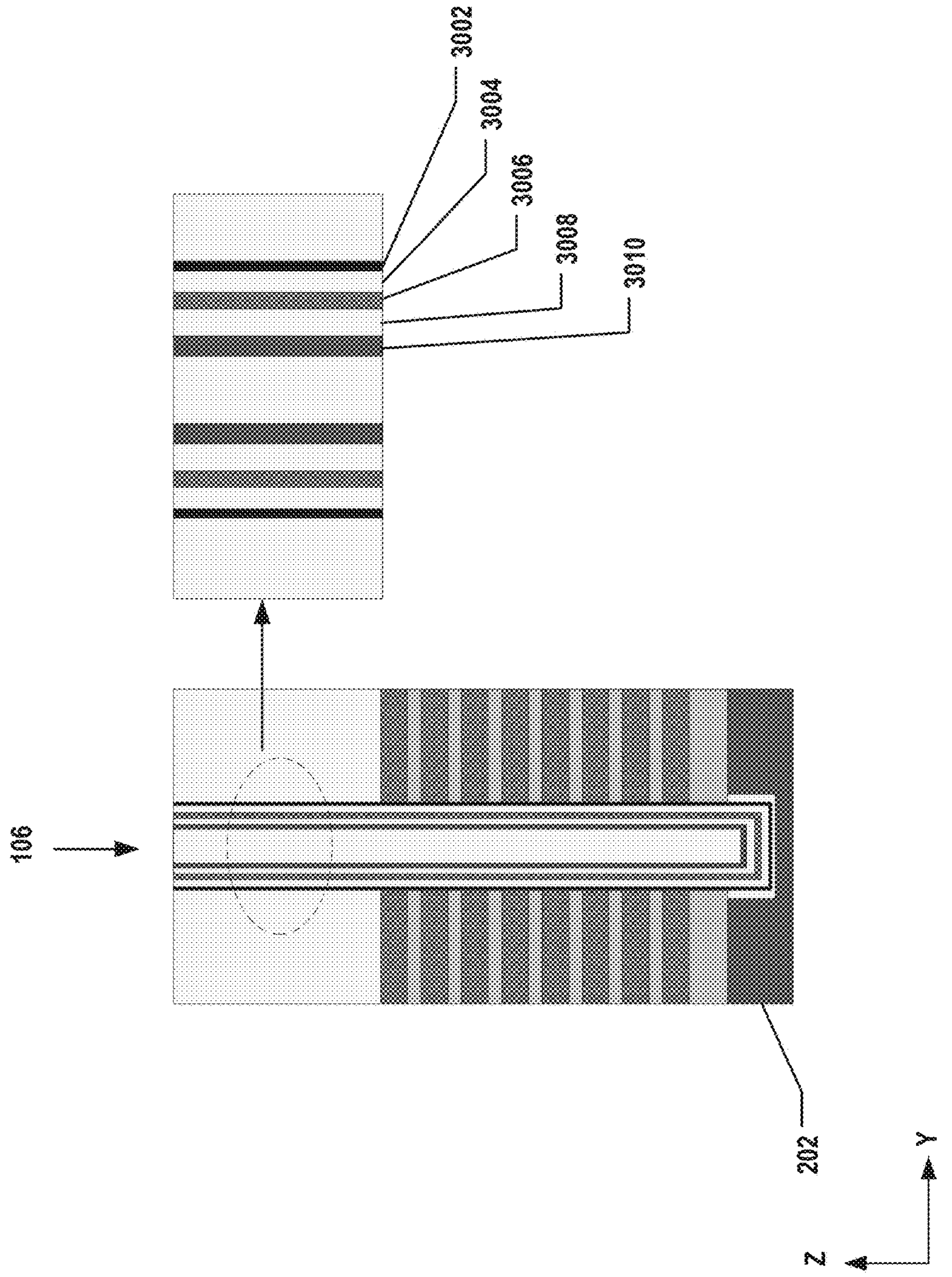
Figure 31:
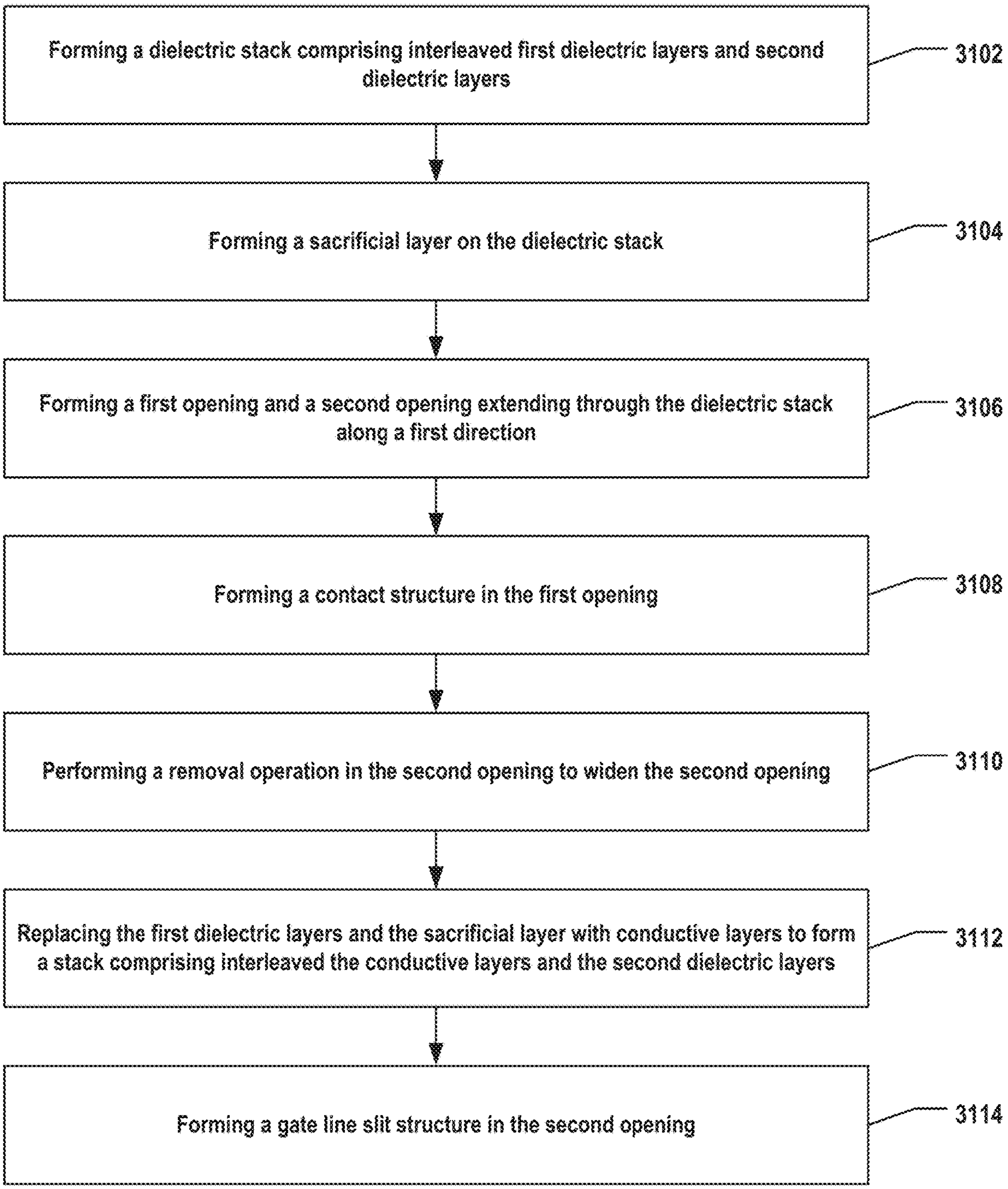
FIG. 31 illustrates a flowchart of a method for forming a memory device, according to some aspects of the present disclosure.

FIG. 30 illustrates channel structure 106. In some implementations, channel structure 106 in cell region 102 may extend in the stack along the Z-direction, and channel structure 106 and contact structure 112 both extend to a semiconductor layer 202. In some implementations, first opening 502, second opening 504, and channel structure openings (not shown) may be formed together in the same etch operations, and first opening 502, second opening 504, and channel structure openings may have the same depth extending to semiconductor layer 202. By forming first opening 502, second opening 504, and channel structure openings together, the process steps could be significantly reduced, and the manufacturing cost could be also lowered.

In some implementations, channel structure 106 may include a high dielectric constant (high-k) dielectrics 3002, a function layer, and a semiconductor channel 3010 arranged radially from a sidewall towards a center of channel structure 106. In some implementations, the function layer may include a silicon oxide layer 3004, a silicon nitride layer 3006, and/or a silicon oxide layer 3008.

FIGS. 32-41 illustrate cross-sectional views of the memory device 3200 at various stages of another fabrication process, according to some aspects of the present disclosure. FIGS. 3-5 illustrate some cross-sectional views of memory device 3200 when performing the manufacturing process. As shown in FIG. 3, a dielectric stack is formed on semiconductor layer 202. FIG. 3 illustrates a cross-sectional view of the memory device along line AA' in FIG. 1. The dielectric stack includes interleaved first dielectric layers 204 and second dielectric layers 206. In some implementations, semiconductor layer 202 may include a doped or undoped polysilicon layer. In some implementations, the dielectric layer pairs, including first dielectric layers 204 and second dielectric layers 206, may extend along the X-direction and the Y-direction. In some implementations, each first dielectric layer 204 may include a layer of silicon nitride, and each second dielectric layer 206 may include a layer of silicon oxide. The dielectric layer pairs may be formed by one or more thin film deposition processes including, but not limited to, CVD, PVD, ALD, or any combination thereof.

Then, a staircase structure 210 is formed at the outer region of the dielectric stack. In some implementations, the outer region of the dielectric stack may include multiple staircase structures. The corresponding edges of the dielectric stack along the vertical direction away from the bottom of the dielectric stack (the positive Z-direction) can be staggered laterally toward cell region 102. In other words, the edges of the dielectric stack in staircase structure 210 can be tilted toward the inner region of the dielectric stack. In some implementations, the length of the dielectric layer pairs increases from the top to the bottom.

In some implementations, the top layer in each level of staircase structure 210 (e.g., each dielectric layer pair) is first dielectric layer 204. After first dielectric layer 204 is replaced by the conductive layers in the later operations, staircase structure 210 may be the word line fan-out. In some implementations, the formation of staircase structure 210 may include multiple etch operations.

As shown in FIG. 3, a sacrificial layer 208 is formed on the dielectric stack. After exposing the plurality of first dielectric layers 204 at the outer region of the dielectric stack, sacrificial layer 208 is formed on each first dielectric layer 204 at the outer region of the dielectric stack. In some implementations, sacrificial layer 208 may include a polysilicon layer. Then, staircase structure 210 is covered by insulating structure 214.

As shown in FIG. 4 and FIG. 5, a first opening 502 and a second opening 504 are formed in the dielectric stack and extend through the dielectric stack along the Z-direction. FIG. 4 shows the cross-sectional view of the memory device along line AA' in FIG. 2, so only first opening 502 could be seen in FIG. 4.

In some implementations, an etch operation or multiple etch operations may be performed to remove portions of the dielectric stack to form first opening 502 and second opening 504 together. In some implementations, insulating structure 214, sacrificial layer 208, first dielectric layer 204, and second dielectric layer 206 are removed to form first opening 502 and second opening 504 together. As shown in FIG. 5, first opening 502 and second opening 504 may have a same depth extending to semiconductor layer 202. In some implementations, first opening 502, second opening 504, and channel structure openings (not shown) may be formed together in the same etch operations, and first opening 502, second opening 504, and channel structure openings may have the same depth extending to semiconductor layer 202. By forming first opening 502, second opening 504, and channel structure openings together, the process steps could be significantly reduced, and the manufacturing cost could be also lowered.

Figure 32:
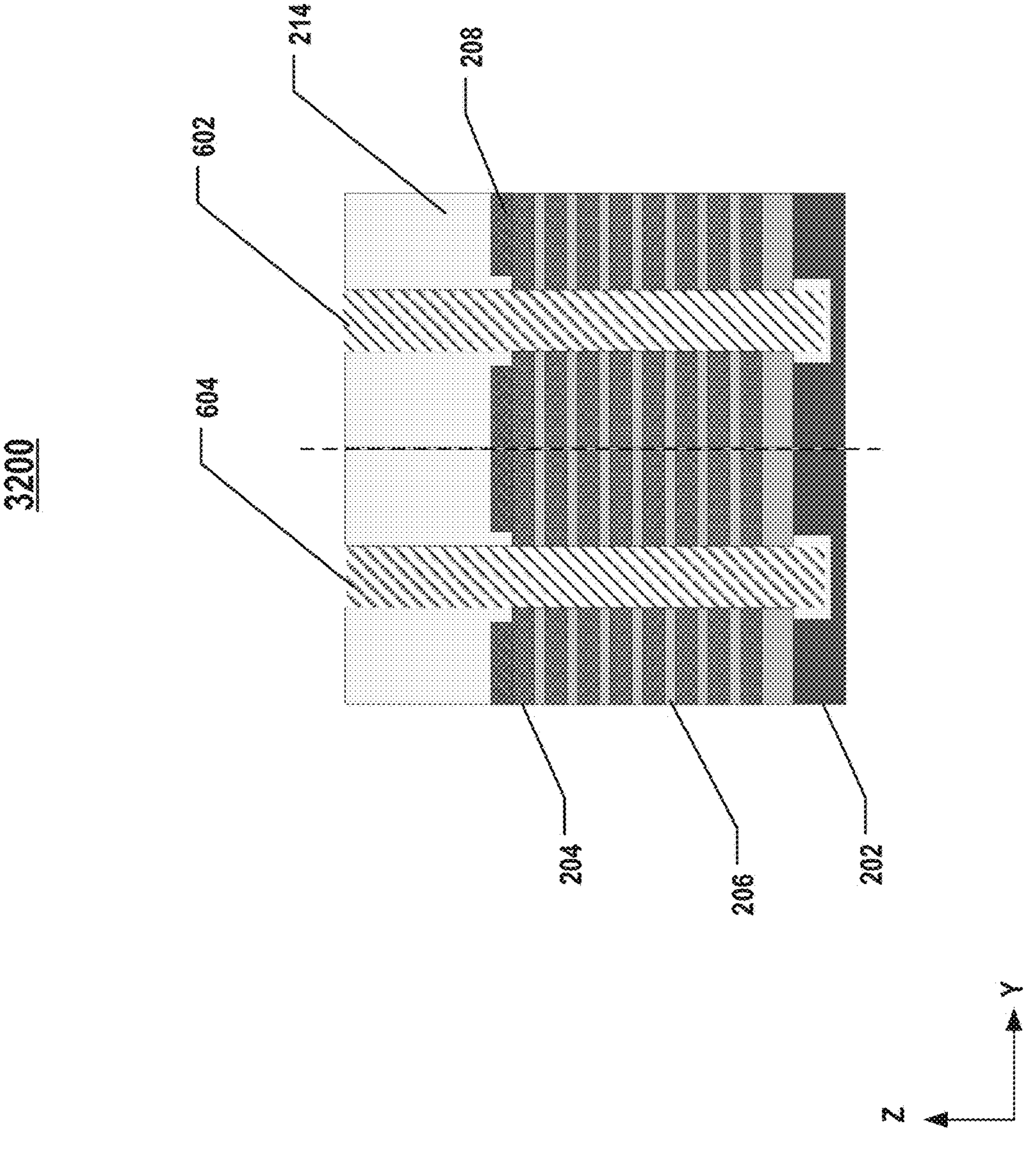
FIGS. 32-41 illustrate cross-sectional views of the memory device at various stages of another fabrication process, according to some aspects of the present disclosure.

As shown in FIG. 32 after forming first opening 502 and second opening 504, a first sacrificial filling 602 is formed in first opening 502, and a second sacrificial filling 604 is formed in second opening 504. In some implementations, first sacrificial filling 602 and second sacrificial filling 604 are formed in first opening 502 and second opening 504 together in a same deposition process.

Figure 33:
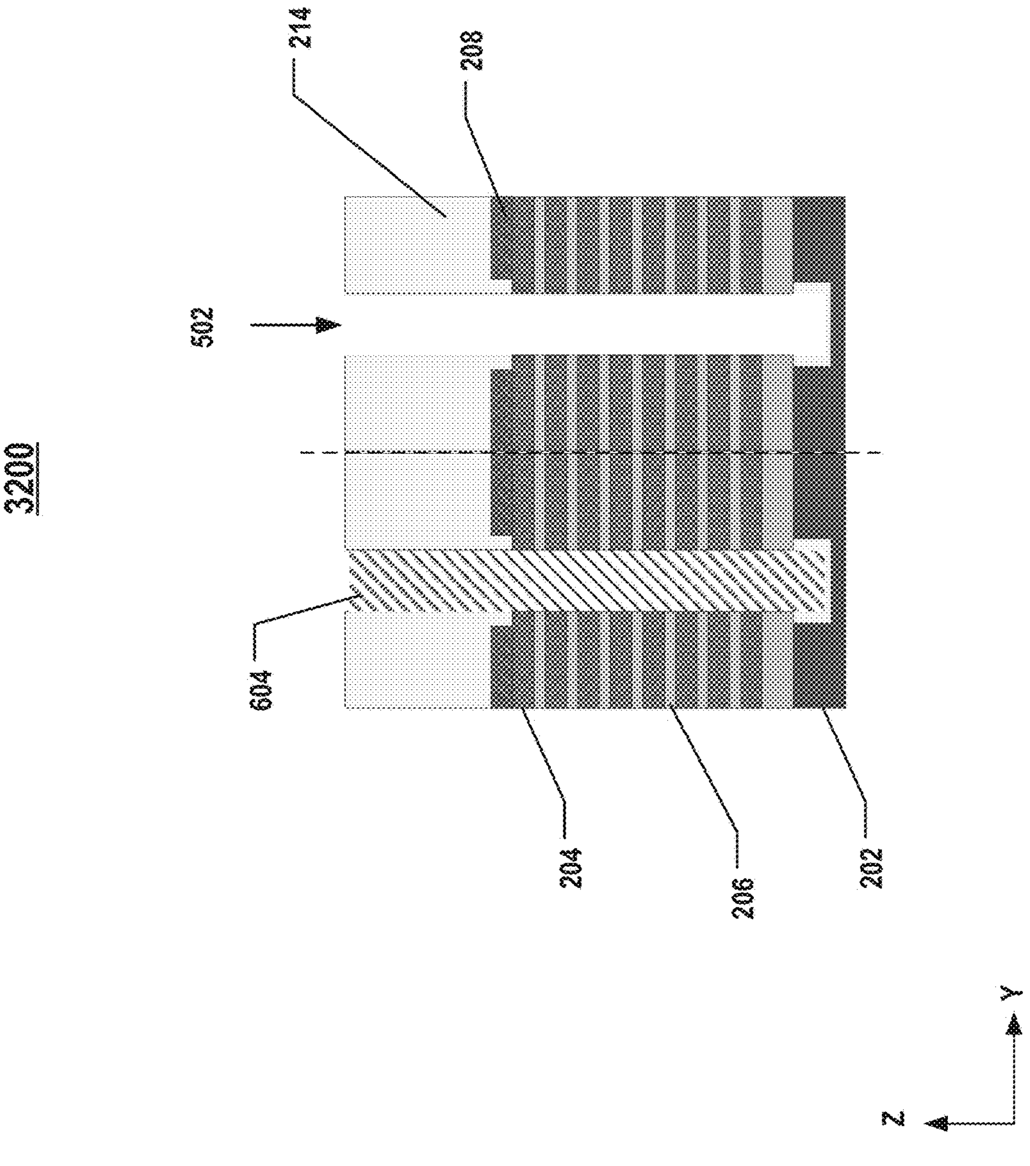
Figure 34:
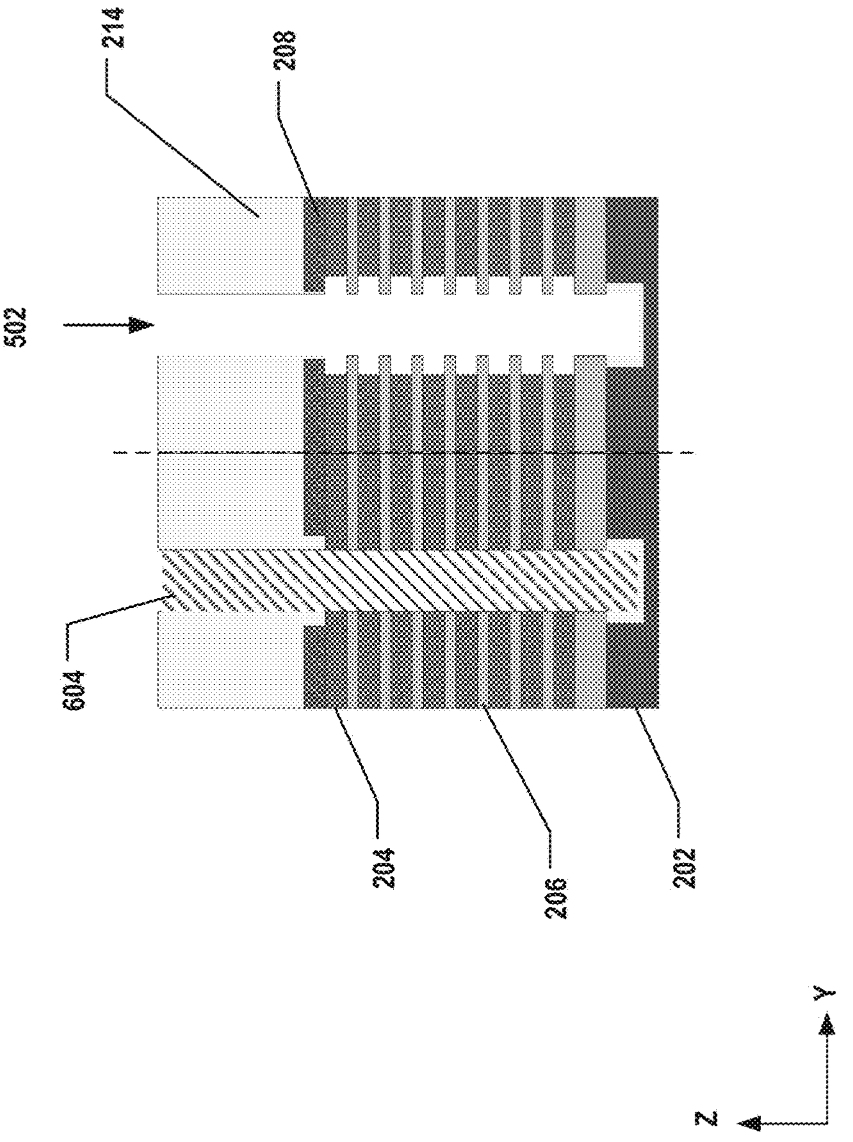

Then, as shown in FIG. 33, first sacrificial filling 602 may be removed to expose first opening 502. In some implementations, in the operation of removing first sacrificial filling 602, portions of first dielectric layer 204 may be also removed. In other words, sacrificial layer 208 may extrude along the sidewalls of first opening 502, as shown in FIG. 34. The extruding structure of sacrificial layer 208 may form a specific shape of the topmost conductive layer in a later operation.

Figure 35:
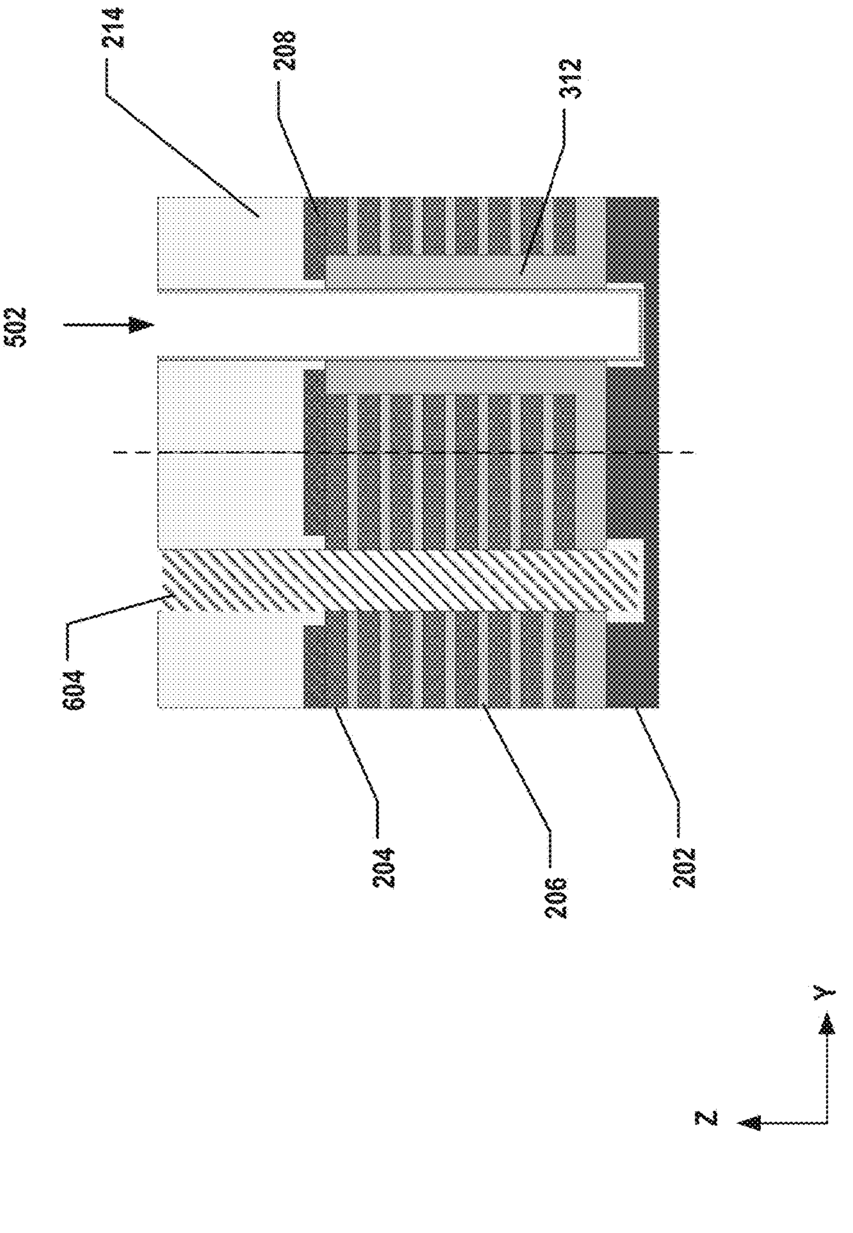

As shown in FIG. 35, spacer layer 312 is formed on the sidewalls of first opening 502. In some implementations, spacer layer 312 may include silicon oxide. After forming spacer layer 312 on the sidewalls of first opening 502, a portion of sacrificial layer 208 is above spacer layer 312, as shown in FIG. 22. In other words, the extruding structure of sacrificial layer 208 may cover the top surface of spacer layer 312.

Figure 36:
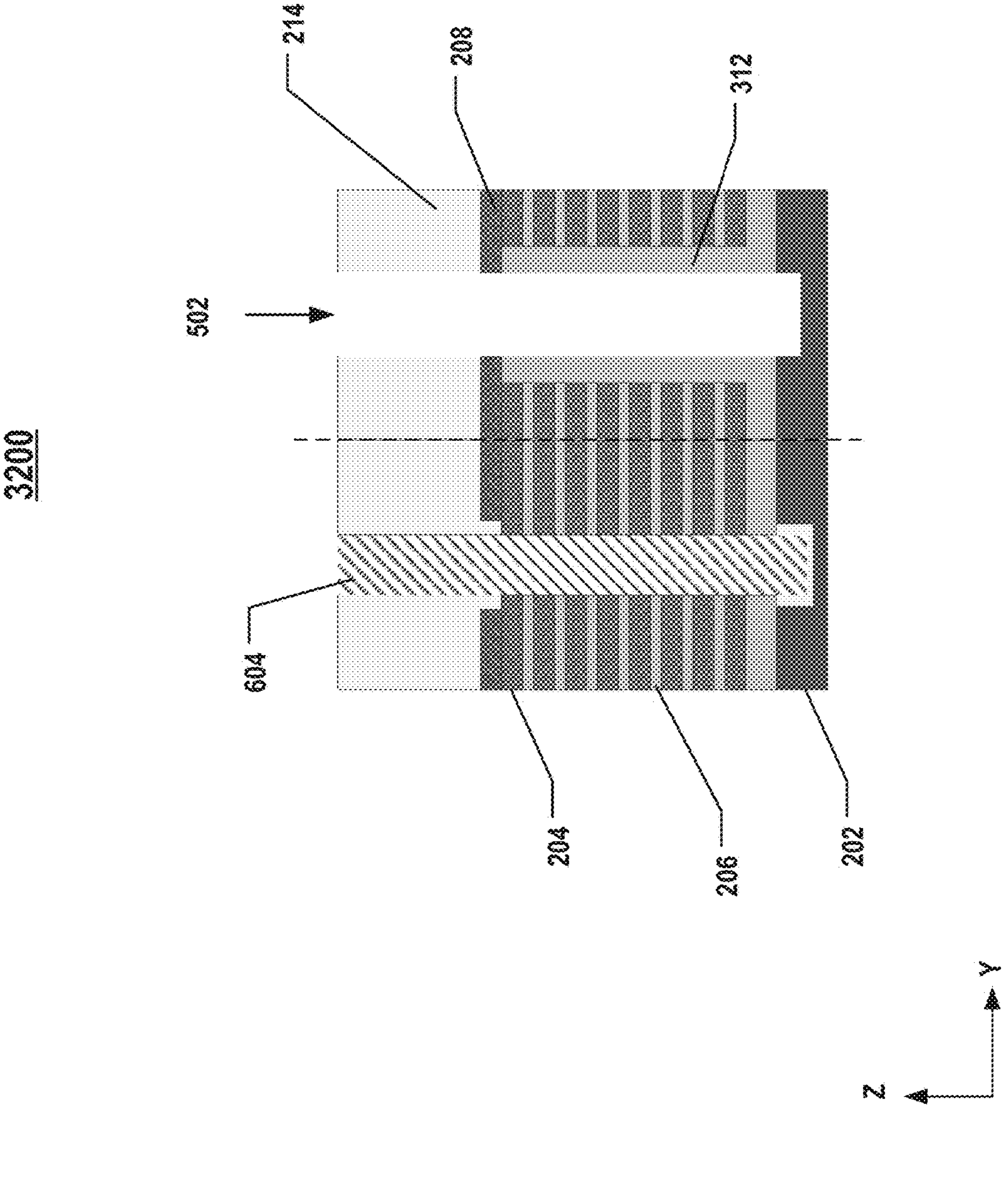

As shown in FIG. 36, a removal operation is performed on the sidewalls of first opening 502 to widen first opening 502. In some implementations, a portion of spacer layer 312 and a portion of insulating structure 214 are removed. In some implementations, sacrificial layer 208 is exposed on the sidewalls of first opening 502 after the removal operation.

Figure 37:
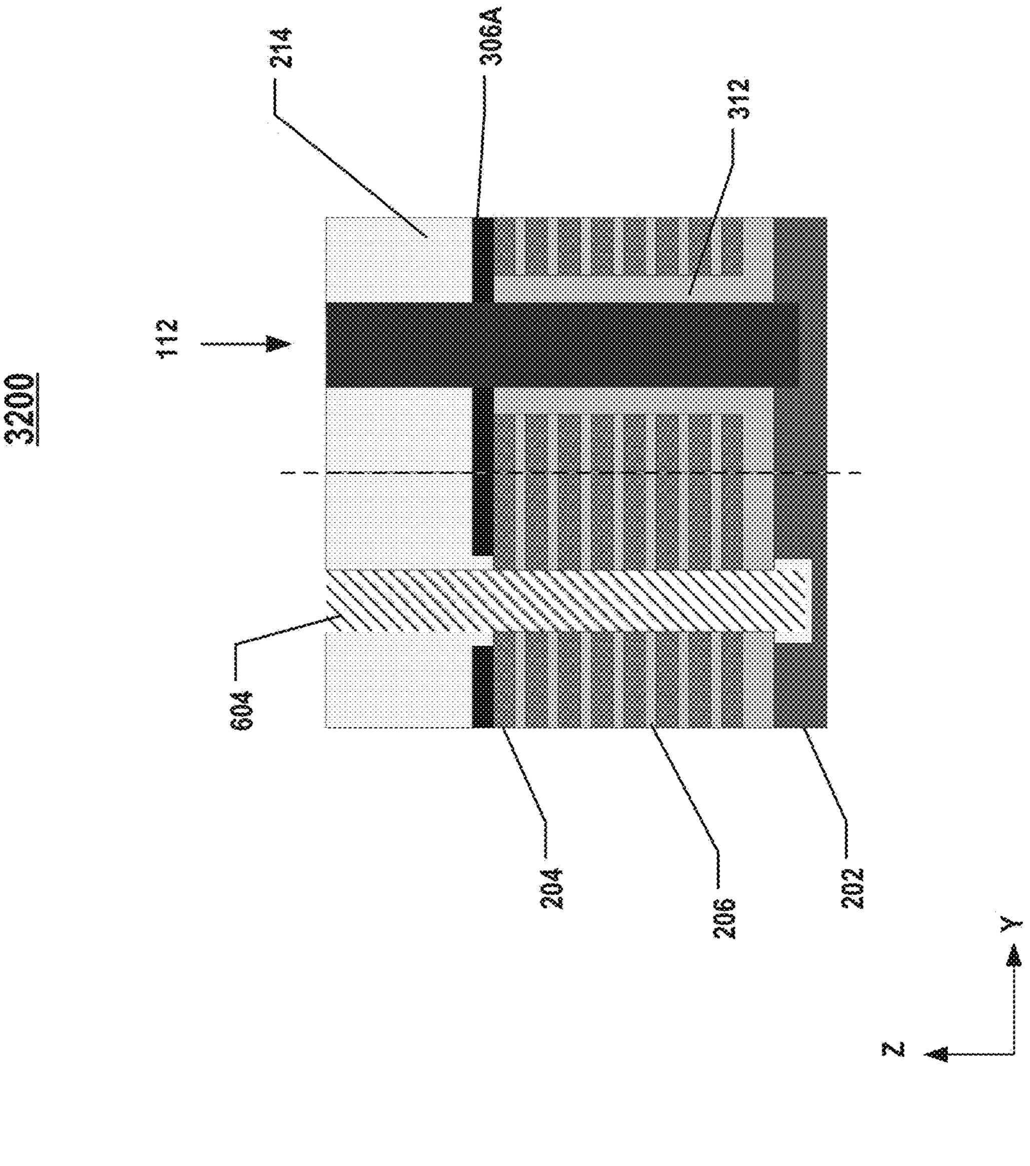

As shown in FIG. 37, sacrificial layer 208 is replaced with a conductive layer 306A and contact structure 112 is formed in first opening 502. In some implementations, sacrificial layer 208 may be removed by an etch operation, and conductive layer 306A and contact structure 112 are formed together. In some implementations, conductive layer 306A and contact structure 112 may include a same material. In some implementations, conductive layer 306A and contact structure 112 may include conductive materials including, but not limited to, W, Co, Cu, Al, polysilicon, doped silicon, silicides, or any combination thereof.

Figure 38:
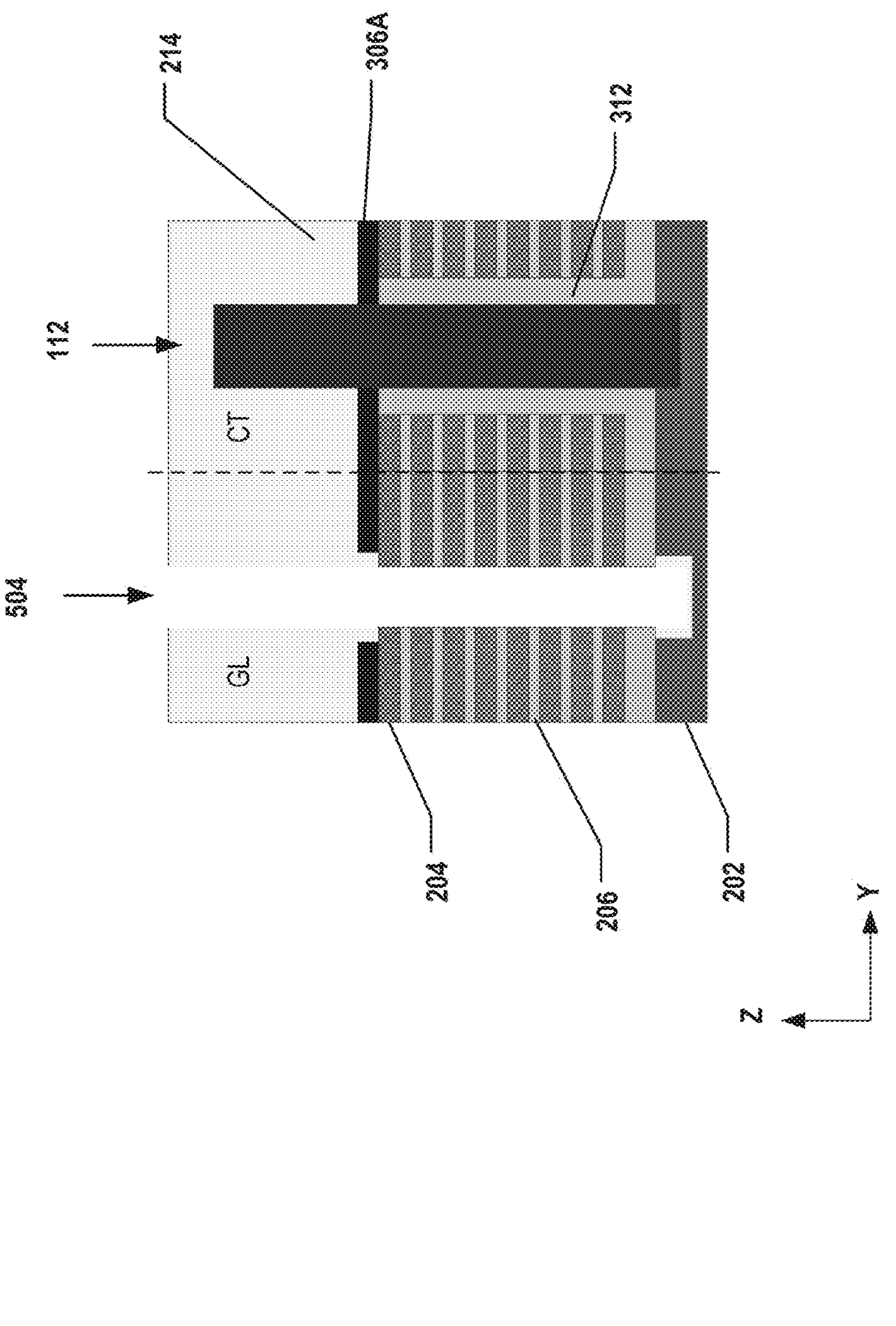
Figure 39:
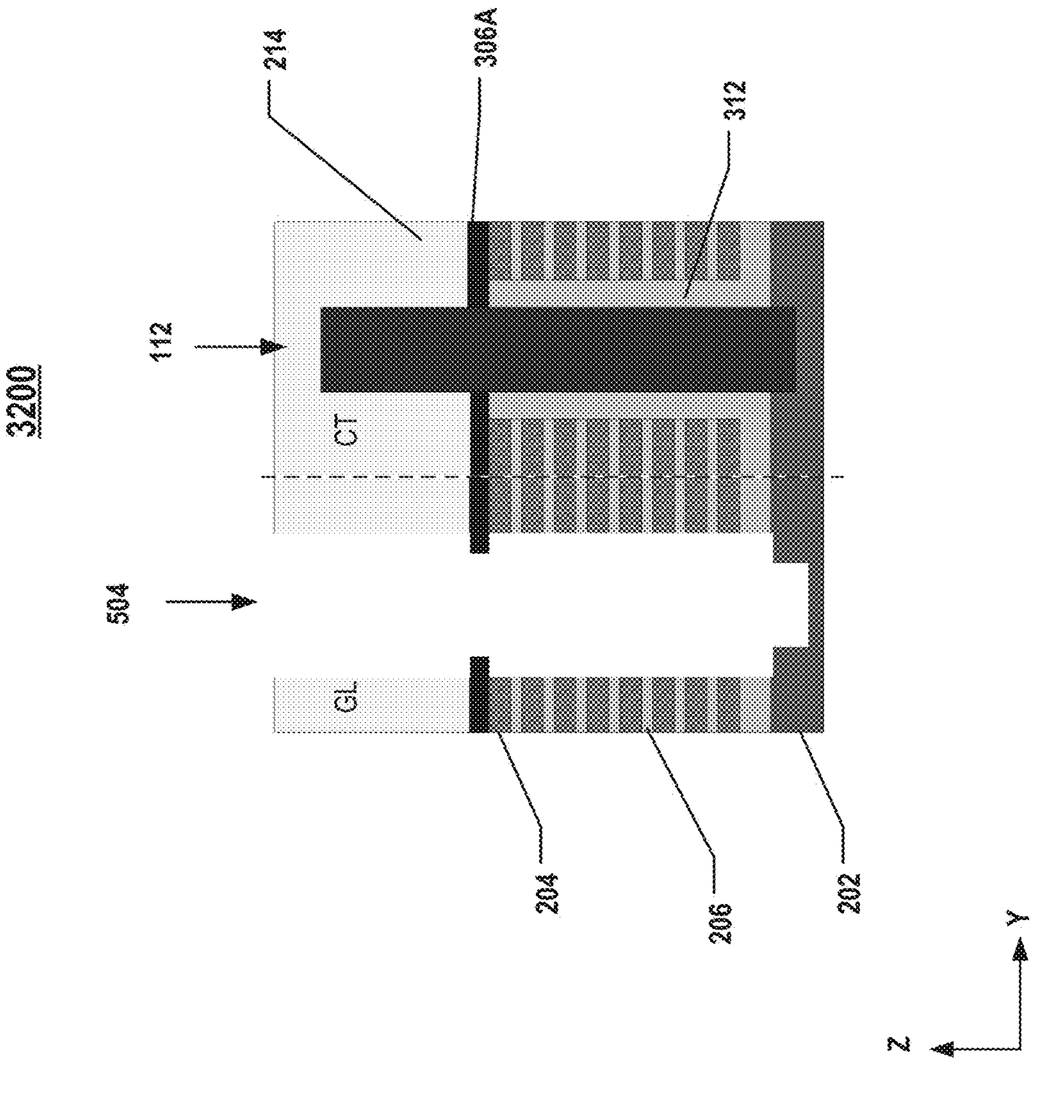

As shown in FIG. 38, second sacrificial filling 604 is removed to expose second opening 504. Then, as shown in FIG. 39, a portion of first dielectric layers 204, a portion of second dielectric layers 206, and a portion of insulating structure 214 are removed along the sidewalls of second opening 504. In other words, second opening 504 may be widened in this operation. In some implementations, the widened second opening 504 may be connected to other widened second opening 504 along the X-direction, and the gate line slit structure 108 formed in the widened second opening 504 in a later operation would be connected to other gate line slit structure 108 along the X-direction in a later operation.

Figure 40:
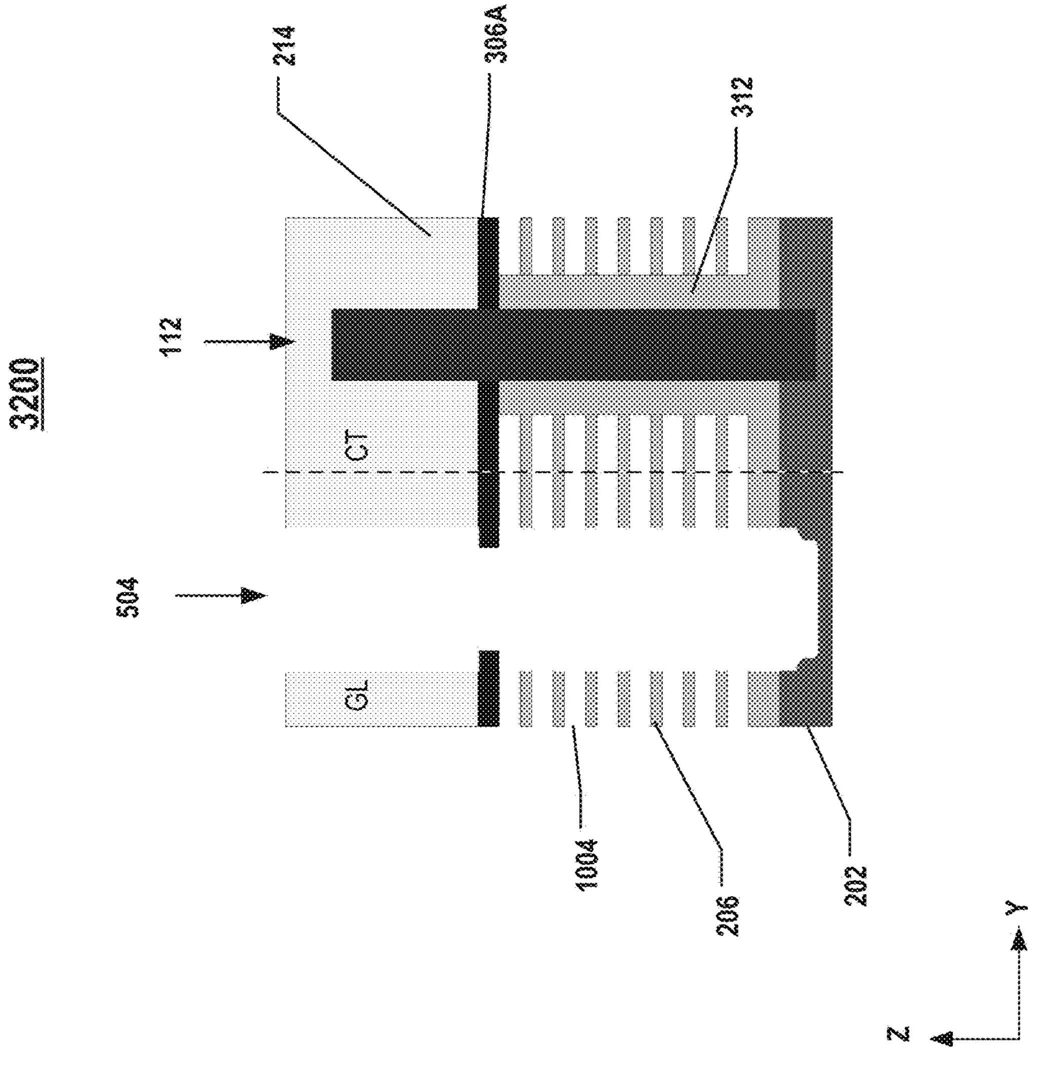

As shown in FIG. 40, first dielectric layers 204 are removed. After removing first dielectric layers 204, multiple cavities 1004 are formed between second dielectric layers 206. Cavity 1004 is also formed under conductive layer 306A.

Figure 41:
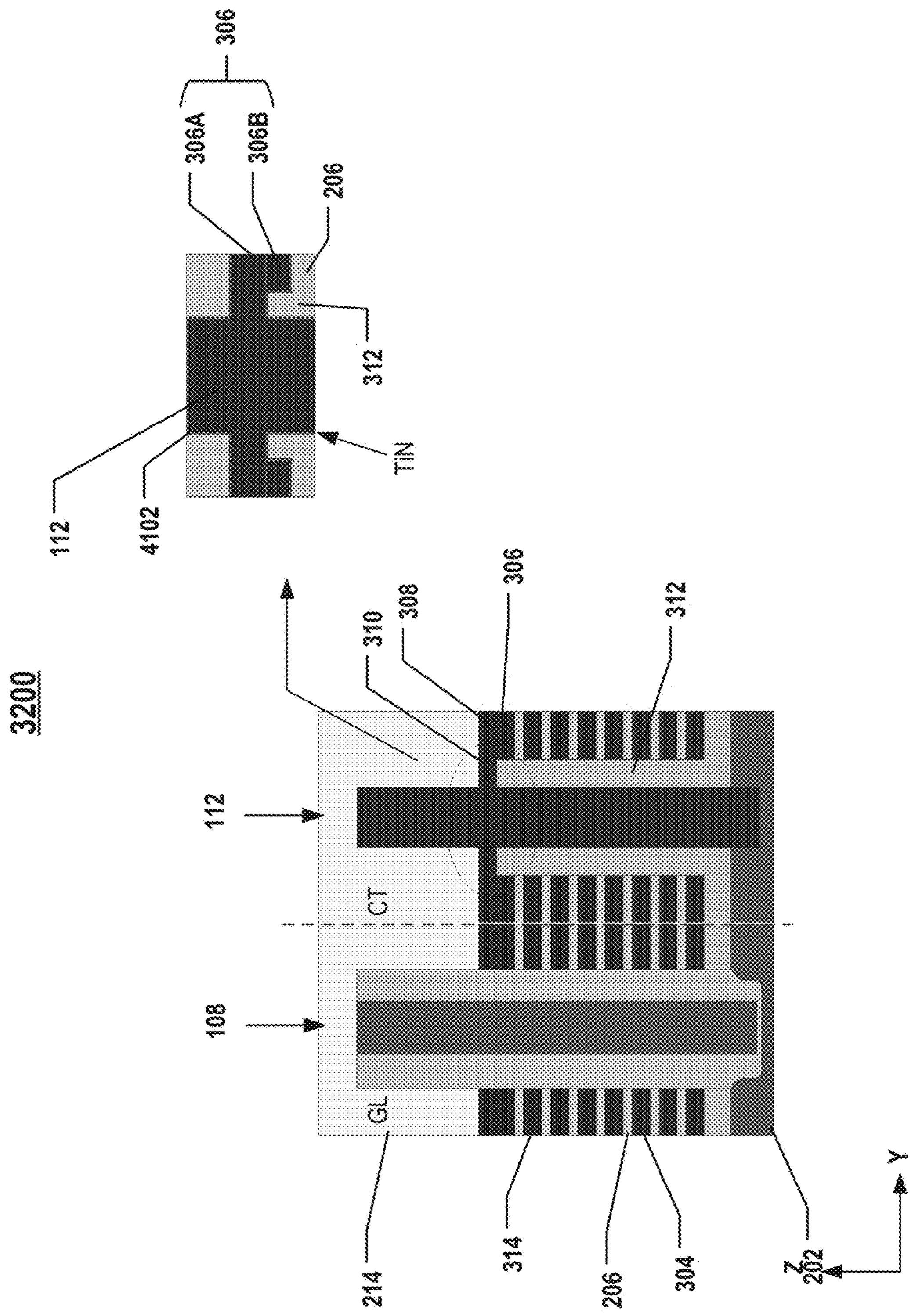

As shown in FIG. 41, conductive layers 304 are formed in cavities 1004. Specifically, a conductive layer 306B is formed under conductive layer 306A, and conductive layer 306A and conductive layer 306B collectively form first conductive layer 306. First conductive layer 306 includes a first portion 308 having a first thickness W1 and a second portion 310 having a second thickness W2 less than the first thickness. First portion 308 of first conductive layer 306 is disposed above second dielectric layer 206, and second portion 310 of first conductive layer 306 is disposed above spacer layer 312. Second portion 310 extrudes out first portion 308 along the Y-direction. In some implementations, a top surface of first portion 308 of first conductive layer 306 is coplanar with a top surface of second portion 310 of first conductive layer 306. In some implementations, second conductive layer 314 has a third thickness less than the first thickness of first portion 308.

As shown in FIG. 41, gate line slit structure 108 is formed in second opening 504. In some implementations, an etch operation is performed to clean the sidewalls of second opening 504 and then gate line slit structure 108 is formed in second opening 504. Because second opening 504 has been widened and therefore, in some implementations, gate line slit structure 108 formed in the widened second opening 504 would be connected to other gate line slit structure 108 along the X-direction. In some implementations, sacrificial structure 902 is removed by performing an etch operation to expose first opening 502.

As shown in FIG. 41, an adhesive layer 4102 may be formed between contact structure 112 and spacer layer 312, between first conductive layer 306 and second dielectric layer 206, and between conductive layer 306A and conductive layer 306B. In other words, adhesive layer 4102 may extend in first conductive layer 306 along the Y-direction. In some implementations, adhesive layer 2902 may include TiN. Because conductive layer 306A and conductive layer 306B are formed in different processes, adhesive layer 2902 may be formed between conductive layer 306A and conductive layer 306B.

In some implementations, first conductive layer 306 includes first portion 308 having a first thickness W1 (thickness of conductive layer 306A plus conductive layer 306B) and second portion 310 having a second thickness W2 (thickness of conductive layer 306A) less than the first thickness. First portion 308 of first conductive layer 306 is disposed above second dielectric layer 206, and second portion 310 of first conductive layer 306 is disposed above spacer layer 312.

Figure 42:
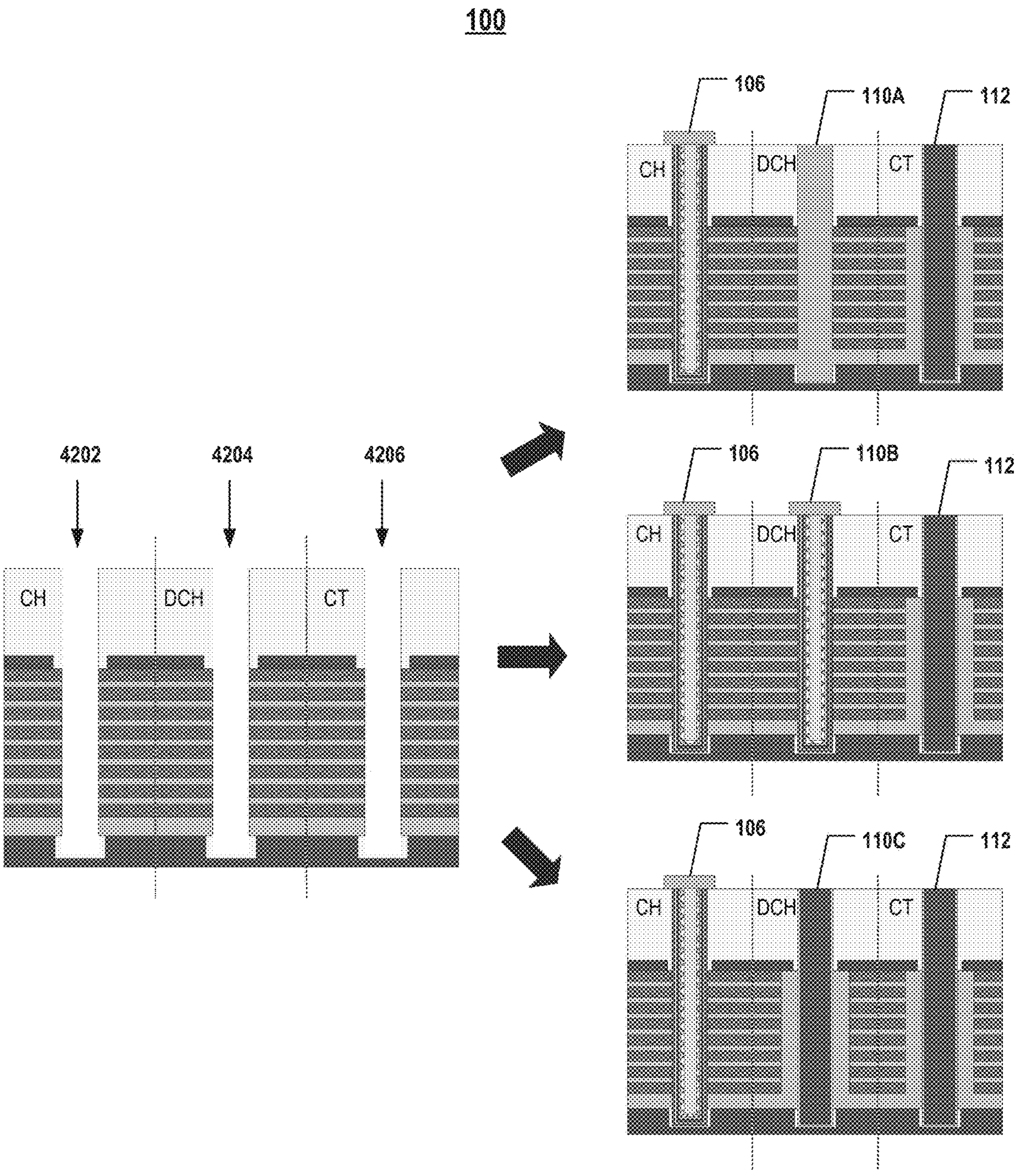
FIG. 42 illustrates a cross-sectional view of a memory device, according to some aspects of the present disclosure.

FIG. 42 illustrates a cross-sectional view of a memory device, according to some aspects of the present disclosure. As shown in FIG. 42, the channel structure opening 4202, the dummy channel structure opening 4204, and the contact structure opening 4206 are formed together in the same etch process. In some implementations, dummy channel structure 110 may have different structure options. After channel structure opening 4202, dummy channel structure opening 4204, and contact structure opening 4206 are formed, dummy channel structure opening 4204 may be filled with dielectric materials, e.g., silicon oxide layer, in a separated process. In other words, the structure and material of dummy channel structure 110A may be different from channel structure 106 and/or contact structure 112. In some implementations, dummy channel structure opening 4204 and channel structure opening 4202 may be filled together in the same process, and dummy channel structure 110B may have a similar or a same structure with channel structure 106. In some implementations, dummy channel structure opening 4204 and contact structure opening 4206 may be filled together in the same process, and dummy channel structure 110C may have a similar or a same structure with contact structure 112. In some implementations, the dummy channel structure is formed after forming the channel structure, and the contact structure is formed after forming the dummy channel structure. In some implementations, the dummy channel and the channel structure are formed together, and the contact structure is formed after forming the dummy channel structure and the channel structure. In some implementations, the dummy channel structure and the contact structure are formed together after forming the channel structure.

By forming contact structure 112, gate line slit structure 108, dummy channel structure 110, and/or the channel structure with the above-mentioned process, the photography processes of the channel structure, the gate line slit structure, the dummy channel structure, and the contact structure are merged, and all deep hole etching processes can be completed in a simplified operation. Hence, the manufacturing process can be simplified, and the manufacturing cost can be also reduced.

Figure 43:
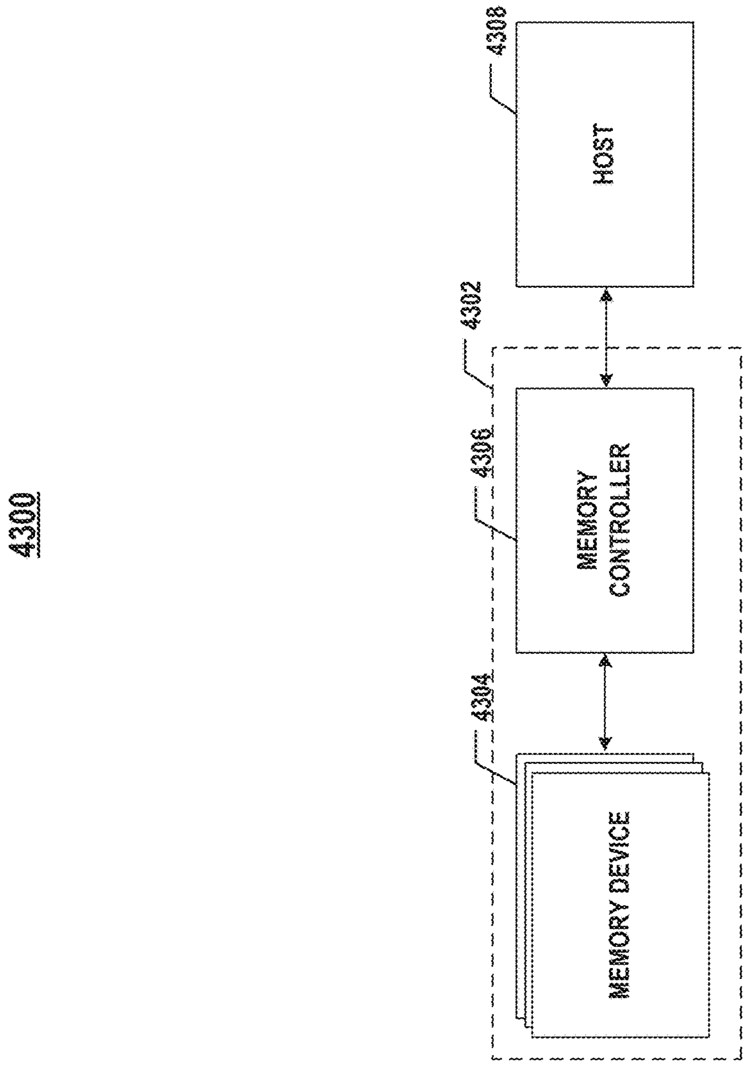
FIG. 43 illustrates a block diagram of an exemplary system having a memory device, according to some aspects of the present disclosure.

FIG. 43 illustrates a block diagram of a system 4300 having a memory device, according to some aspects of the present disclosure. System 4300 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 43, system 4300 can include a host 4308 and a memory system 4302 having one or more memory devices 4304 and a memory controller 4306. Host 4308 can be a processor of an electronic device, such as a central processing unit (CPU), or a system-on-chip (SoC), such as an application processor (AP). Host 4308 can be configured to send or receive the data to or from memory devices 4304.

Memory device 4304 can be any memory devices disclosed herein, such as memory devices 100, 1900, or 32000. In some implementations, memory device 4304 includes an array of memory cells each including a vertical transistor, as described above in detail.

Memory controller 4306 is coupled to memory device 4304 and host 4308 and is configured to control memory device 4304, according to some implementations. Memory controller 4306 can manage the data stored in memory device 4304 and communicate with host 4308. Memory controller 4306 can be configured to control operations of memory device 4304, such as read, write, and refresh operations. Memory controller 4306 can also be configured to manage various functions with respect to the data stored or to be stored in memory device 4304 including, but not limited to, refresh and timing control, command/request translation, buffer and schedule, and power management. In some implementations, memory controller 4306 is further configured to determine the maximum memory capacity that the computer system can use, the number of memory banks, memory type and speed, memory particle data depth and data width, and other important parameters. Any other suitable functions may be performed by memory controller 4306 as well. Memory controller 4306 can communicate with an external device (e.g., host 4308) according to a particular communication protocol. For example, memory controller 4306 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A semiconductor device, comprising:

a stack comprising interleaved conductive layers and dielectric layers stacked along a first direction; and a contact structure extending through the stack along the first direction, wherein the conductive layers comprise a first conductive layer and a second conductive layer under the first conductive layer, and the first conductive layer is in contact with the contact structure; and wherein the first conductive layer comprises a first portion having a first thickness and a second portion having a second thickness less than the first thickness, and the second portion is in contact with the contact structure on one side and is in contact with the first portion on an opposing side.

2. The semiconductor device of claim 1, wherein the second conductive layer has a third thickness less than the first thickness.

3. The semiconductor device of claim 2, wherein the second conductive layer is insulated with the contact structure by a spacer layer extending along the first direction.

4. The semiconductor device of claim 3, wherein the first portion of the first conductive layer is disposed above the plurality of dielectric layers, and the second portion of the first conductive layer is disposed above the spacer layer.

5. The semiconductor device of claim 1, wherein the first portion of the first conductive layer is in contact with the second portion of the first conductive layer, and the second portion extrudes out the first portion along a second direction perpendicular to the first direction.

6. The semiconductor device of claim 5, wherein a top surface of the first portion of the first conductive layer is coplanar with a top surface of the second portion of the first conductive layer.

7. The semiconductor device of claim 3, further comprising:

an adhesive layer between the first conductive layer and the contact structure.

8. The semiconductor device of claim 3, further comprising:

an adhesive layer extending in the first conductive layer along a second direction perpendicular to the first direction.

9. The semiconductor device of claim 1, wherein the stack comprises at least one staircase structure, the first conductive layer is disposed at a topmost layer of the at least one staircase structure.

10. A memory system, comprising:

a memory device configured to store data, and comprising:

a stack comprising interleaved conductive layers and dielectric layers stacked along a first direction; and a contact structure extending through the stack along the first direction, wherein the conductive layers comprise a first conductive layer and a second conductive layer under the first conductive layer, and the first conductive layer is in contact with the contact structure; and wherein the first conductive layer comprises a first portion having a first thickness and a second portion having a second thickness less than the first thickness, and the second portion is in contact with the contact structure on one side and is in contact with the first portion on an opposing side; and a memory controller coupled to the memory device and configured to control the memory device through the contact structure.

* * * * *